(12) United States Patent
Ferrari et al.

(10) Patent No.: US 11,696,504 B2
(45) Date of Patent: Jul. 4, 2023

(54) METHOD OF FABRICATION OF AN INTEGRATED THERMOELECTRIC CONVERTER, AND INTEGRATED THERMOELECTRIC CONVERTER THUS OBTAINED

(71) Applicant: STMICROELECTRONICS S.r.l., Agrate Brianza (IT)

(72) Inventors: Paolo Ferrari, Gallarate (IT); Flavio Francesco Villa, Milan (IT); Lucia Zullino, Milan (IT); Andrea Nomellini, Milan (IT); Luca Seghizzi, Milan (IT); Luca Zanotti, Agrate Brianza (IT); Bruno Murari, Monza (IT); Martina Scolari, Milan (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 17/321,252

(22) Filed: May 14, 2021

(65) Prior Publication Data
US 2021/0359189 A1    Nov. 18, 2021

(30) Foreign Application Priority Data
May 18, 2020  (IT) .......................... 102020000011335

(51) Int. Cl.
*H10N 10/855* (2023.01)
*H10N 10/01* (2023.01)
*H10N 10/17* (2023.01)

(52) U.S. Cl.
CPC ........... *H10N 10/855* (2023.02); *H10N 10/01* (2023.02); *H10N 10/17* (2023.02)

(58) Field of Classification Search
CPC ......... H01L 35/22; H01L 35/32; H01L 35/34; H10N 10/00–856; H10N 19/101
See application file for complete search history.

(56) References Cited

U.S. PATENT DOCUMENTS

2006/0102223 A1    5/2006  Chen et al.
2011/0048488 A1    3/2011  Gabriel et al.
(Continued)

FOREIGN PATENT DOCUMENTS

CN    103199188 B    6/2016
CN    106486593 B    9/2018
(Continued)

OTHER PUBLICATIONS

KR 20100060820 A, Machine Translation (Year: 2010).*
(Continued)

*Primary Examiner* — Devina Pillay
(74) *Attorney, Agent, or Firm* — Seed Intellectual Property Law Group LLP

(57) ABSTRACT

A method of fabricating a thermoelectric converter that includes providing a layer of a Silicon-based material having a first surface and a second surface, opposite to and separated from the first surface by a Silicon-based material layer thickness; forming a plurality of first thermoelectrically active elements of a first thermoelectric semiconductor material having a first Seebeck coefficient, and forming a plurality of second thermoelectrically active elements of a second thermoelectric semiconductor material having a second Seebeck coefficient, wherein the first and second thermoelectrically active elements are formed to extend through the Silicon-based material layer thickness, from the first surface to the second surface; forming electrically conductive interconnections in correspondence of the first surface and of the second surface of the layer of Silicon-based material, for electrically interconnecting the plurality of first thermoelectrically active elements and the plurality of second thermoelectrically active elements, and forming an input electrical terminal and an output electrical terminal electrically connected to the electrically conductive inter-
(Continued)

connections, wherein the first thermoelectric semiconductor material and the second thermoelectric semiconductor material comprise Silicon-based materials selected among porous Silicon or polycrystalline SiGe or polycrystalline Silicon.

11 Claims, 38 Drawing Sheets

(56) References Cited

U.S. PATENT DOCUMENTS

| | | |
|---|---|---|
| 2011/0083711 A1 | 4/2011 | Plissonnier et al. |
| 2011/0174362 A1 | 7/2011 | Tanner et al. |
| 2015/0068576 A1* | 3/2015 | Kryskowski ............ H01L 35/32 |
| | | 136/212 |

FOREIGN PATENT DOCUMENTS

| | | | | |
|---|---|---|---|---|
| DE | 10 2006 015 492 A1 | 10/2007 | | |
| KR | 20100060820 A * | 7/2010 | ......... | H01L 31/0547 |
| WO | 2018/078515 A1 | 5/2018 | | |

OTHER PUBLICATIONS

Strasser, M. et al.; "Miniaturized thermoelectric generators based on poly-Si and poly-SiGe surface micromachining"; Elsevier Science B.V.; 2002; 8 pages.

Tomita, M. et al.; "10W/cm2-Class High Power Density Planar Si-Nanowire Thermoelectric Energy Harvester Compatible with CMOS-VLSI Technology"; VLSI Technology Digest of Technical Papers; 2018; 2 pages.

* cited by examiner

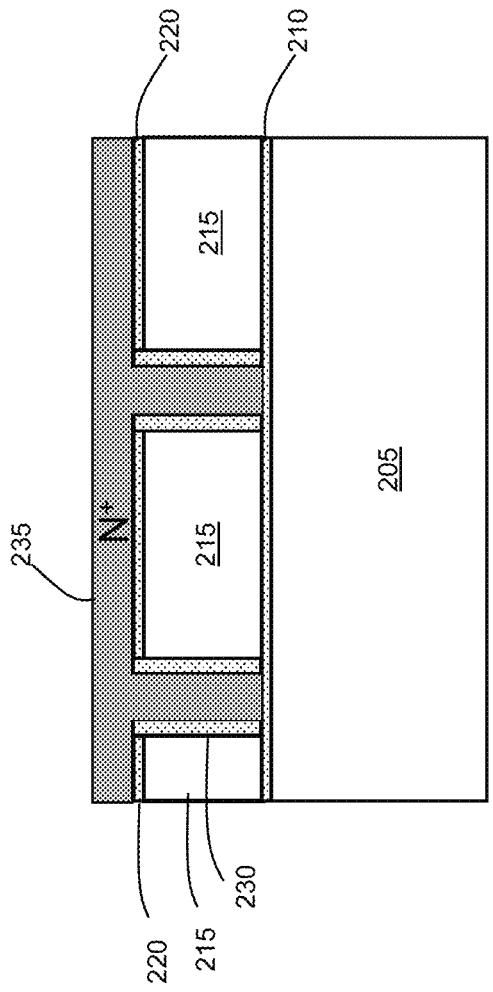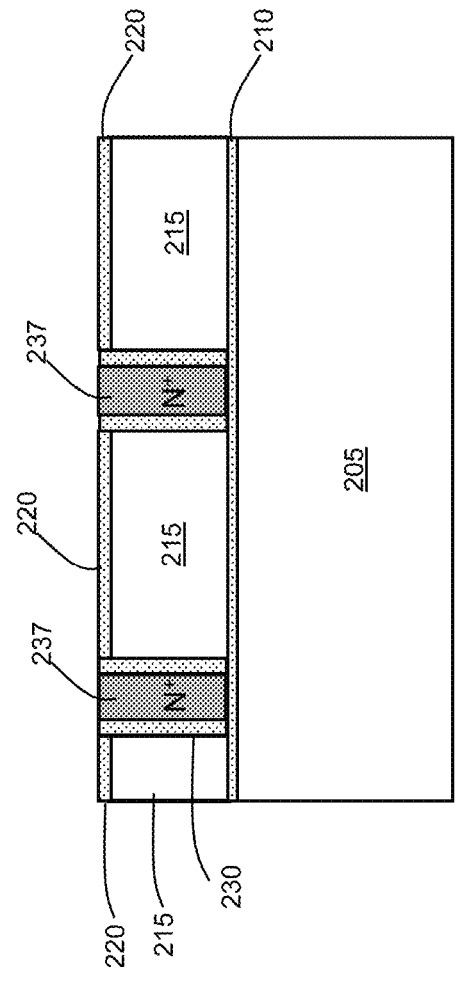

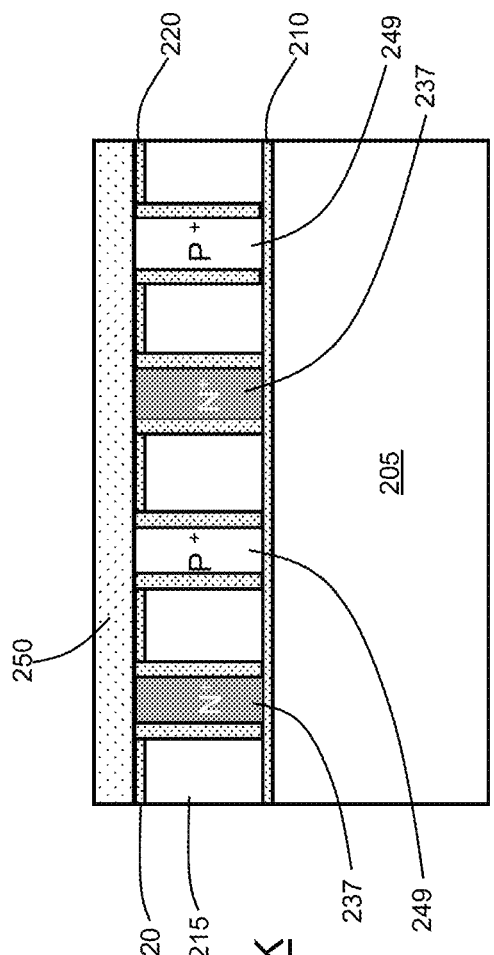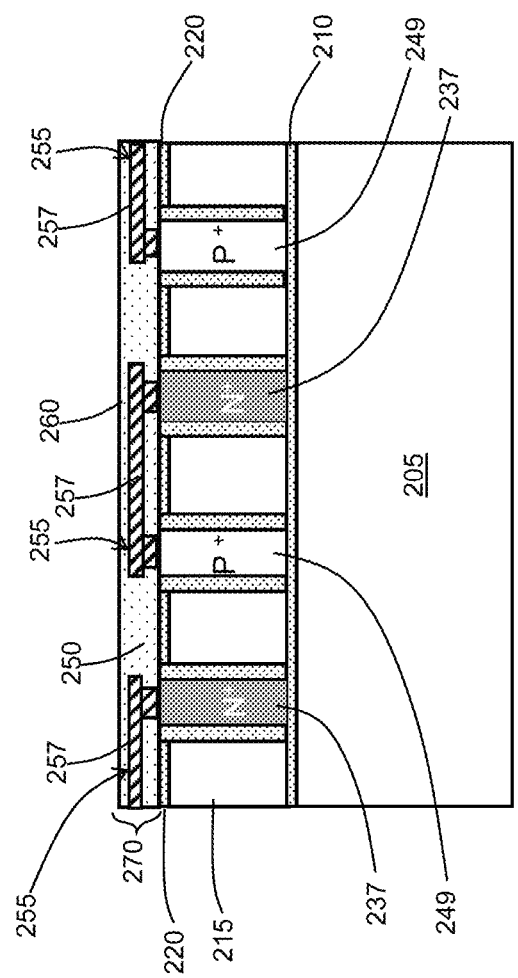

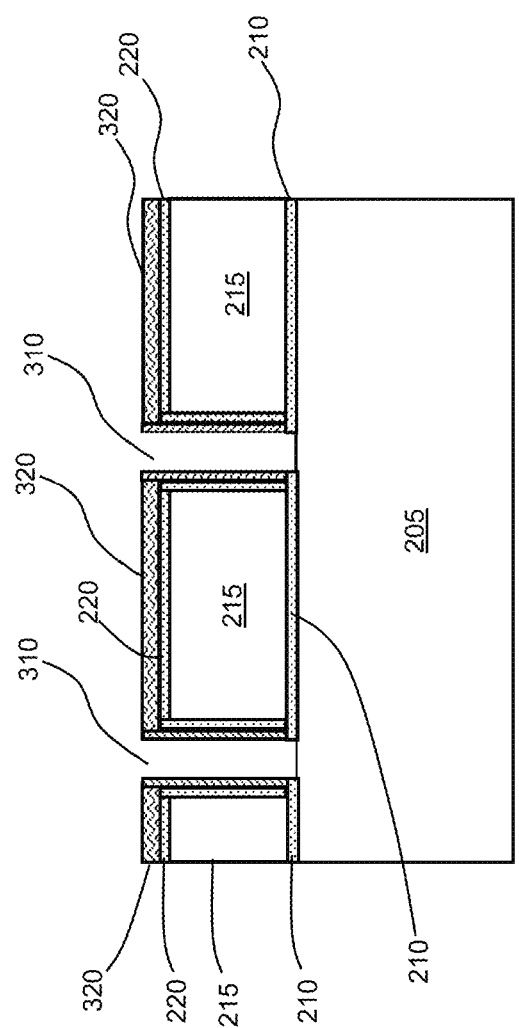

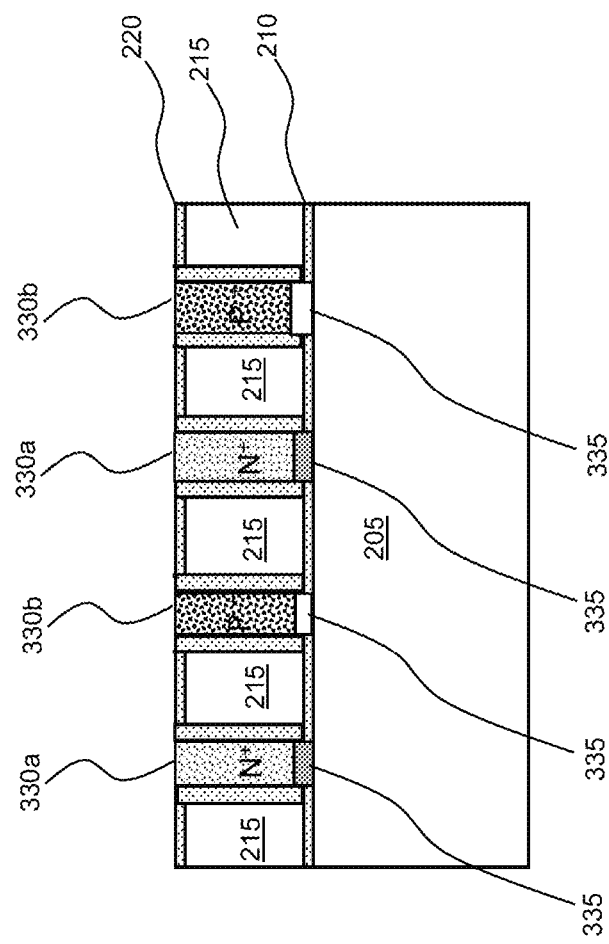

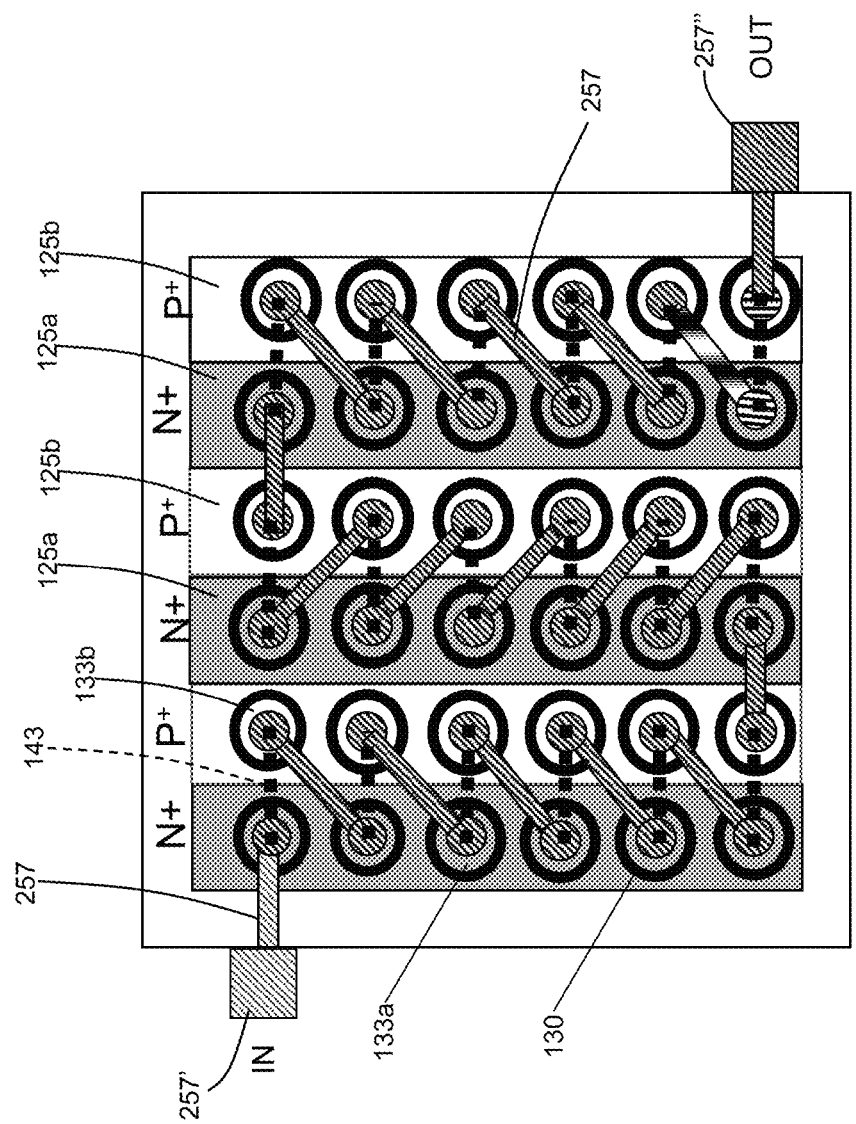

METHOD OF FABRICATION OF AN INTEGRATED THERMOELECTRIC CONVERTER, AND INTEGRATED THERMOELECTRIC CONVERTER THUS OBTAINED

BACKGROUND

Technical Field

The present disclosure generally relates to the field of solid-state technology, particularly semiconductor technology and devices, and more particularly to a solid-state, integrated thermoelectric converter, like a ThermoElectric Generator (aka "TEG"), and to a fabrication method thereof.

Description of the Related Art

Direct conversion of thermal energy into electric energy (and vice-versa) by Seebeck effect is a promising approach for harvesting energy from heat sources, particularly when reduced temperature gradients are involved and that, as such, would otherwise not be exploited (such as waste heat of industrial plants, residual heat of car engines, low temperature thermal sources).

Thermoelectric generators are low enthalpy waste heat exploitation devices that are used, for example, in battery-free radiator valve actuators or in torches (in this latter case, exploiting the difference in temperature between the human body temperature and the ambient temperature).

Thermoelectric generators make use of thermoelectric materials that are capable of generating power directly from the heat by converting temperature differences into electric voltage.

A good thermoelectric material should have both high electrical conductivity ($\sigma$) and low thermal conductivity ($\kappa$). Having low thermal conductivity ensures that when one side of the material is made hot, the other material side stays cold, which helps to generate a significant voltage even with a low temperature gradient.

Tellurium-based thermoelectric generators make use, as thermoelectric material, of materials based on Tellurium.

Tellurium compounds, such as Bismuth Telluride ($Bi_2Te_3$), exhibit good Seebeck coefficients (the Seebeck coefficient, also known as thermopower, thermoelectric power, thermoelectric sensitivity, of a material is a measure of the magnitude of an induced thermoelectric voltage in response to a temperature difference across that material, as induced by the Seebeck effect), high electrical conductivity and low thermal conductivity (just as an example, the thermal conductivity of Bismuth Telluride is 2 W/mK). These properties make Bismuth Telluride suitable to be used to form the "thermoelectrically active elements" of a thermoelectric generator (by "thermoelectrically active elements" or "active elements" it is meant the thermoelectric elements in thermoelectric material that are capable of converting a thermal drop or temperature gradient across them into an electric potential by Seebeck effect).

A Tellurium-based thermoelectric generator includes a plurality of interconnected n-doped Bismuth Telluride active elements and p-doped Bismuth Telluride active elements (the active elements being also referred to as "legs") between a pair of opposite ceramic substrates provided with metal (Cu or Au) contact regions and conductive lines, that interconnect the plurality of n-doped and p-doped Bismuth Telluride active elements. The n-doped Bismuth Telluride active elements are formed as discrete elements, typically by means of a process that involves forming ingots starting from powder material and then dicing the ingots to form pellets that will then form the Seebeck legs when the pellets are put (in a manual or semi-automatic assembling stage) between the two ceramic substrate.

The existing Tellurium-based thermoelectric generators are therefore discrete components. Bismuth Telluride is not suitable to be used as a material in standard Integrated Circuit (IC) manufacturing processes, which instead are based on Silicon.

Moreover, Tellurium-based thermoelectric generators typically exhibit a relatively good efficiency only in a limited temperature range (usually, of the order of 100 K around room temperature) and thermoelectric properties that rapidly degrade as temperature increases. This reduces the fields of application of the Tellurium-based thermoelectric generators.

Additionally, Tellurium is a relatively rare element, which inherently limits a widespread use thereof.

Furthermore, an extensive use of Tellurium compounds, such as Bismuth Telluride, could pose environmental problems, in particular in term of end-of-life device disposal.

In silicon-based thermoelectric generators, materials based on Silicon (n-doped and p-doped, so as to exhibit different Seebeck coefficients) are used as thermoelectric material to form the active elements.

Silicon-based thermoelectric generators manufactured with Silicon-compatible technologies can be classified in two families: in devices of a first family the heat flow is parallel to the substrate whereas in the other family the heat flow is orthogonal to the substrate ("out-of-plane" heat flux). The architectures of these integrated thermoelectric generators generally comprise a number of elementary cells having n-p doped legs, arranged in such a way that the elementary cells are thermally in parallel and electrically in series. Typically, integrated thermoelectric generators in which heat flows parallel to the substrate may have conductive legs of thermoelectrically active materials deposited over a very high thermal resistance material or a membrane, suspended several hundreds of micrometers above the substrate, or the legs of active materials themselves are free-standing (membrane-less).

Out-of-plane heat flux thermoelectric generators minimizes thermal losses, simplify thermal coupling at system level, enhancing overall performance, and are amenable to miniaturization and integration in microelectronic and optoelectronic devices, among other applications.

The paper by M. Tomita et al., "10 µW/cm2-Class High Power Density Planar Si-Nanowire Thermoelectric Energy Harvester Compatible with CMOS-VLSI Technology", $38^{th}$ IEEE Symposium on VLSI Technology, VLSI Technology 2018, Honolulu, United States, 18-22/6/18 criticizes planar Si-based thermoelectric generators employing long Si-nanowires about 10-100 µm as active elements, which are suspended on a cavity to cutoff the bypass of the heat current to secure the temperature difference across the Si-nanowires. The authors of the paper propose a design concept of planar and short Si-nanowires thermoelectric generator without cavity structure, which uses a steep temperature gradient formed in the vicinity of the main heat current.

WO 2018/078515 discloses an integrated thermoelectric generator of out-of-plane heat flux configuration. The generator further includes a top capping layer deposited onto a free surface, oriented in an opposite direction in respect to said void spaces, of said planar electrically non-conductive cover layer so as to occlude the through holes of the non-conductive cover layer.

BRIEF SUMMARY

The Applicant has realized that the Silicon-based thermoelectric generators proposed in the art exhibit drawbacks.

Silicon has a large electrical conductivity and a good Seebeck coefficient, but, as a thermoelectric material, it has the disadvantage of featuring a high thermal conductivity (148 W/mK) compared to Bismuth Telluride (which has a thermal conductivity of 2 W/mK). Furthermore, Silicon-based thermoelectric generators having a cavity have a low mechanical stability because of the presence of the cavity. Other drawbacks of known Silicon-based thermoelectric generators are: difficulty to industrialize; low power (~100 $\mu W/cm^2$); and high semiconductor area consumption.

The Applicant has tackled, among others, the problem of devising a novel thermoelectric converter overcoming, among others, the drawbacks that affect known thermoelectric generators.

The Applicant has found that the active elements of thermoelectric converters can be realized in alternative materials (other than Bismuth Telluride and Silicon as known in the art) which are good thermoelectric materials and that are suitable for standard IC manufacturing techniques, thereby making it possible to fabricate integrated thermoelectric converters.

The Applicant has found that an alternative good thermoelectric material suitable for realizing the active elements of an integrated thermoelectric converter is porous Silicon, e.g., n-doped or p-doped.

n-doped and p-doped porous Silicon thermoelectrically active elements can be obtained by converting $n^+$ and $p^+$ doped polycrystalline Silicon. Porous Silicon has an advantageously small thermal conductivity (0.15-1.5 W/m K for porosity ~75%).

The Applicant has also found that another suitable alternative good thermoelectric material for realizing the active elements of an integrated thermoelectric converter is polycrystalline Silicon Germanium (polycrystalline SiGe), e.g., n-doped or p-doped. Polycrystalline SiGe features a thermal conductivity of 3-5 W/mK, and Applicant uses it as a material for realizing active elements of a thermoelectric converter.

Another thermoelectric material for realizing the active elements of an integrated thermoelectric converter is polycrystalline Silicon, e.g., n-doped and p-doped.

According to an aspect of the present disclosure, a method of fabricating an out-of-plane (e.g., with heat flux orthogonal to the substrate) thermoelectric converter comprises:
  providing a layer of a Silicon-based material having a first surface and a second surface, opposite to and separated from the first surface by a Silicon-based material layer thickness;
  forming a plurality of first thermoelectrically active elements of a first thermoelectric semiconductor material having a first Seebeck coefficient, and forming a plurality of second thermoelectrically active elements of a second thermoelectric semiconductor material having a second Seebeck coefficient, wherein the first and second thermoelectrically active elements are formed to extend through the Silicon-based material layer thickness, from the first surface to the second surface;
  forming electrically conductive interconnections in correspondence of the first surface and of the second surface of the layer of Silicon-based material, for electrically interconnecting the plurality of first thermoelectrically active elements and the plurality of second thermoelectrically active elements, and
  forming an input electrical terminal and an output electrical terminal electrically connected to the electrically conductive interconnections.

The first thermoelectric semiconductor material and the second thermoelectric semiconductor material comprise Silicon-based materials selected among porous Silicon or polycrystalline SiGe or polycrystalline Silicon.

In embodiments, the layer of a Silicon-based material is a material selected among polySiGe, particularly $polyS_{10.7}Ge_{0.3}$, or Epipoly-Si.

In embodiments, the plurality of first thermoelectrically active elements of the first thermoelectric semiconductor material having a first Seebeck coefficient comprises doped porous Silicon or polycrystalline SiGe or polycrystalline Silicon doped with acceptor dopants or donor dopants, and the plurality of second thermoelectrically active elements of said second thermoelectric semiconductor material having a second Seebeck coefficient comprises doped porous Silicon or polycrystalline SiGe or polycrystalline Silicon doped with donor dopants or acceptor dopants, respectively.

In embodiments, said providing the layer of a Silicon-based material comprises growing epitaxially a layer of polycrystalline Silicon on oxidized surface of a substrate.

In embodiments, said forming the plurality of first thermoelectrically active elements of the first thermoelectric semiconductor material having a first Seebeck coefficient comprises:
  forming first trenches in the layer of a Silicon-based material; and
  filling the first trenches with acceptor or donor dopants doped polycrystalline Silicon or polycrystalline SiGe.

In embodiments, said forming the plurality of second thermoelectrically active elements of the second thermoelectric semiconductor material having a second Seebeck coefficient comprises:
  forming second trenches in the layer of a Silicon-based material; and
  filling the second trenches with donor or acceptor dopants doped polycrystalline Silicon or polycrystalline SiGe.

In embodiments, the method may further comprise converting the doped polycrystalline Silicon filling the first and second trenches into doped porous Silicon.

In embodiments, said providing the layer of a Silicon-based material comprises:
  iterating at least twice the following steps:
    forming a layer of polycrystalline SiGe on an oxidized surface of a substrate, wherein said layer of polycrystalline SiGe has a fractional thickness compared to said Silicon-based material layer thickness;
    selectively doping first regions of the layer of polycrystalline SiGe with acceptor or donor dopants, and selectively doping second regions of the layer of polycrystalline SiGe with donor or acceptor dopants,
  such that after said iterating, a stack of the individual layers of polycrystalline SiGe has an overall thickness corresponding to said Silicon-based material layer thickness; and
  forming trenches in the stack of the individual layers of polycrystalline SiGe to obtain separated portions of doped first regions and doped second regions.

According to another aspect of the present disclosure, an out-of-plane integrated thermoelectric converter is proposed. The device comprises:
  a layer of a Silicon-based material having a first surface and a second surface, opposite to and separated from the first surface by a Silicon-based material layer thickness;

a plurality of first thermoelectrically active elements of a first thermoelectric semiconductor material having a first Seebeck coefficient, and a plurality of second thermoelectrically active elements of a second thermoelectric semiconductor material having a second Seebeck coefficient, wherein the first and second thermoelectrically active elements extend through the Silicon-based material layer thickness, from the first surface to the second surface;

electrically conductive interconnections in correspondence of the first surface and of the second surface of the layer of Silicon-based material, for electrically interconnecting the plurality of first thermoelectrically active elements and the plurality of second thermoelectrically active elements, and an input electrical terminal and an output electrical terminal electrically connected to the electrically conductive interconnections.

The first thermoelectric semiconductor material and the second thermoelectric semiconductor material comprise Silicon-based materials selected among porous Silicon or polycrystalline Silicon or polycrystalline SiGe.

In embodiments, said layer of a Silicon-based material is a material selected among polySiGe, particularly $polyS_{10.7}Ge_{0.3}$ or Epipoly-Si.

In embodiments, said first thermoelectric semiconductor material having a first Seebeck coefficient is porous Silicon or polycrystalline Silicon or polycrystalline SiGe doped with acceptor dopants or donor dopants and said second thermoelectric semiconductor material having a second Seebeck coefficient is porous Silicon or polycrystalline Silicon or polycrystalline SiGe doped with donor dopants or acceptor dopants, respectively.

In embodiments:

each of the plurality of first and second thermoelectrically active elements and each of the second thermoelectrically active elements has a first end at the first surface and a second end at the second surface of the layer of Silicon-based material, the electrically conductive interconnections electrically connect:

the first end of a generic first thermoelectrically active element to the first end of a second thermoelectrically active element; and the second end of the generic first thermoelectrically active element to the second end of another second thermoelectrically active element, so that the plurality of first thermoelectrically active elements and the plurality of second thermoelectrically active elements are connected in series and alternated to one another.

According to still another aspect of the present disclosure, an electronic system comprising a thermoelectric converter according to the previous aspect is proposed.

Advantages stemming from the use of such alternative materials for forming the active elements of a thermoelectric converter are:

easiness of industrialization;

power levels of the order of one mA (whereas conventional thermoelectric generator structures feature power levels of about 100 $\mu W/cm^2$ for a typical $\Delta T=10$ K);

capability to work with low or high $\Delta T$;

no mechanical stability problems; and low area consumption.

BRIEF DESCRIPTION OF THE SEVERAL VIEWS OF THE DRAWINGS

These and other features and advantages of the present disclosure will be made apparent by the following description of example embodiments thereof, provided merely as non-limitative examples.

For its better intelligibility, the following description should be read making reference to the attached drawings, wherein:

FIGS. 2A-2L show some steps of a fabrication method of a thermoelectric converter according to an example embodiment of the present disclosure;

FIGS. 3A-3I show some steps of a fabrication method of a thermoelectric converter according to still an example embodiment of the present disclosure;

FIG. 5 shows, in top plan view, a layout of a thermoelectric converter obtained by a method according to an example embodiment of the present disclosure, including steps shown in FIGS. 1A-1G and steps similar to those of FIGS. 4A-4E;

DETAILED DESCRIPTION OF EXAMPLE EMBODIMENTS

Figure 1A:
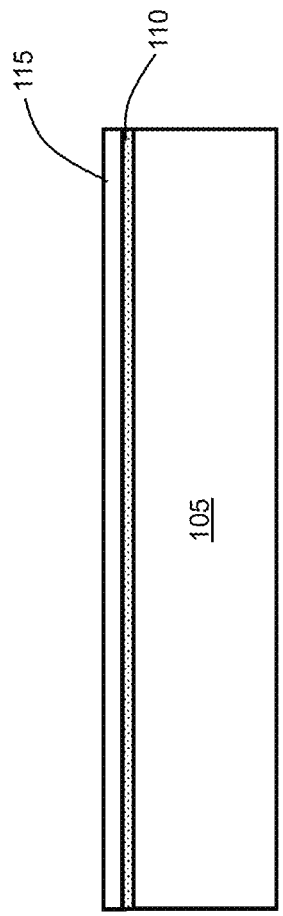
FIGS. 1A-1G show some steps of a fabrication method of a thermoelectric converter according to an example embodiment of the present disclosure.

It is pointed out that the drawings in the figures are not necessarily drawn to scale.

In the following, reference will be made to the drawings, which show some steps of fabrication methods of a thermoelectric converter according to example embodiments of the present disclosure. In the drawings, like and/or corresponding elements are denoted by like reference numerals.

Reference is firstly made to FIGS. 1A-1G, which show some steps of a fabrication method according to an example embodiment of the present disclosure.

Starting from a Silicon substrate (first Silicon wafer) 105, a surface of the Silicon substrate 105 is oxidized (e.g., by means of thermal oxidation) to form a layer of oxide 110, e.g., Silicon dioxide ($SiO_2$). Then, a layer 115 of polycrystalline SiGe is formed over the layer of oxide 110. The resulting structure is schematically depicted in FIG. 1A.

The layer 115 of polycrystalline SiGe is for example a layer of polycrystalline $Si_{0.7}Ge_{0.3}$. The layer 115 of polycrystalline SiGe can for example be formed by means of deposition, for example, but not limitatively, chemical deposition, for example, Chemical Vapor Deposition (CVD); among the several different CVD techniques, Low Pressure CVD (LPCVD) can for example be exploited. Deposition takes place from silane ($SiH_4$) and germane ($GeH_4$). Alternatively, the layer 115 of SiGe polysilicon can be formed by means of epitaxial growth in an epitaxial reactor. Both techniques produce a conformal layer 115 of polycrystalline SiGe.

The layer 115 of polycrystalline SiGe can for example have a thickness of some microns, e.g., about 1 μm.

Figure 1B:
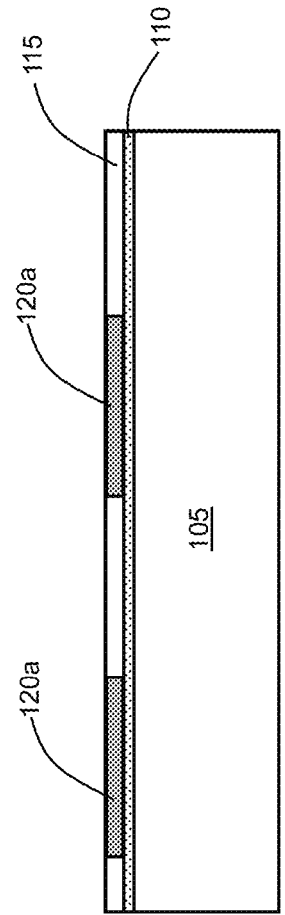
Figure 1C:
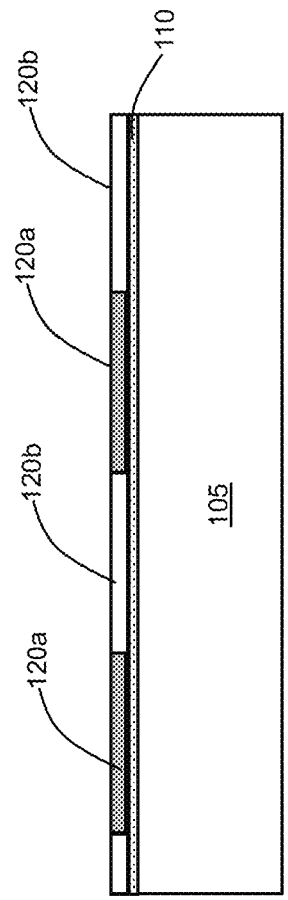

Then, as depicted in FIGS. 1B and 1C, alternated n+ doped regions 120a and p+ doped regions 120b of n+ doped and, respectively, p+ doped polycrystalline SiGe are formed in the layer 115 of polycrystalline SiGe. The dopants (donor dopants for the n+ doped regions 120a and acceptor dopants for the p+ doped regions 120b) can be selectively introduced into the layer 115 of polycrystalline SiGe by ion implantation. For example, suitable donor dopants can be Phosphorus or Arsenic, a suitable acceptor dopant can be Boron. The n+ doped regions 120a and p+ doped regions 120b can for example take the shape of substantially parallel strips formed in the layer 115 of polycrystalline SiGe (where "parallel" is meant to intend along a direction orthogonal to the plane of the drawing sheet of FIGS. 1B and 1C), alternated and for example (but not limitatively) contiguous to each other (in a direction from the left to the right of the drawing sheet).

Figure 1D:
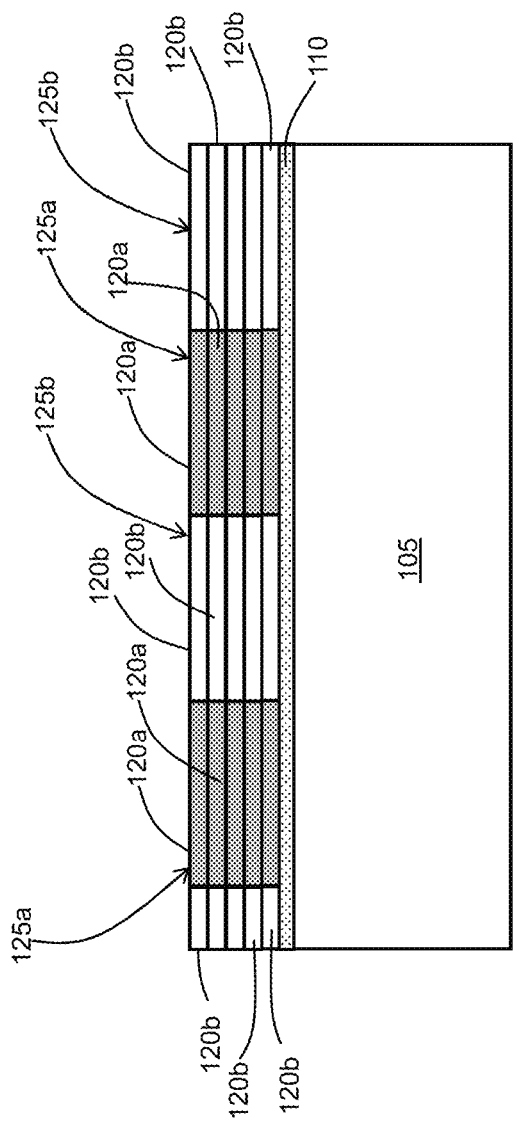

The steps of forming a layer of polycrystalline SiGe and forming, in the layer of polycrystalline SiGe, n+ and p+ doped regions are repeated twice or more times. As depicted in FIG. 1D, every new layer of polycrystalline SiGe is formed (for example by the same technique as the first layer 115 of polycrystalline SiGe) on the preceding layer of polycrystalline SiGe, and in each newly formed layer of polycrystalline SiGe n+ and p+ doped regions 120a and 120b are formed (for example, by ion implantation) in (vertical, e.g., in a direction from the bottom to the top of the drawing sheet of FIG. 1D) alignment with the previously formed n+ and p+ doped regions 120a and 120b formed in the preceding layer(s) of polycrystalline SiGe. In this way, stacks 125a of n+ doped regions and stacks 125b of p+ doped regions are obtained, from which the thermoelectric elements of the thermoelectric converter will be formed. In this way, the stacks 125a of n+ doped regions and the stacks 125b of p+ doped regions take the form of substantially parallel strips formed in the stack of layers of polycrystalline SiGe (where, again, "parallel" is meant to intend along the direction orthogonal to the plane of the drawing sheet of FIG. 1D), alternated and for example (but not limitatively) contiguous to each other (in the direction from the left to the right of the drawing sheets), as visible, e.g., in FIG. 1E.

The number of times that the steps of forming a layer of polycrystalline SiGe and forming, in the layer of polycrystalline SiGe, n+ and p+ doped regions are repeated depends on the thickness of each one of the layers of polycrystalline SiGe (the stacked layers of polycrystalline SiGe may have all the same thickness or different thicknesses from each other), and on the desired overall thickness of the stack of layers of polycrystalline SiGe. The overall thickness of the stack of layers of polycrystalline SiGe should be such as to ensure a sufficient thermal difference between the bottom and the top of the stacks 125a of n+ doped regions and stacks 125b of p+ doped regions, even for relatively low temperature gradients. For example, the overall thickness of the stack of layers of polycrystalline SiGe can be of some tens of microns, particularly from about 10 μm to about 30 μm (thus, for an example thickness of the generic layer of polycrystalline SiGe of about 1 μm, the steps of forming a layer of polycrystalline SiGe and forming, in the layer of polycrystalline SiGe, n+ and p+ doped regions are repeated some tens of times).

Figure 1F:
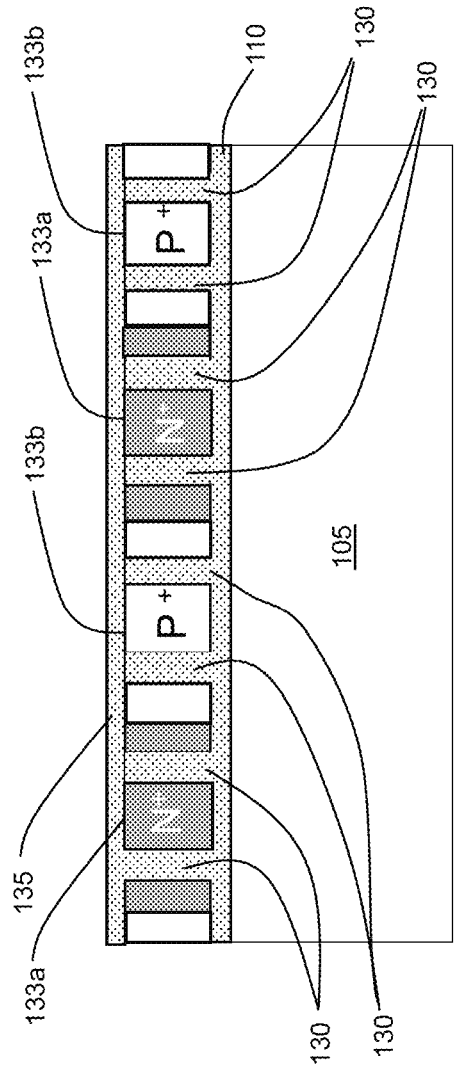
Figure 1E:
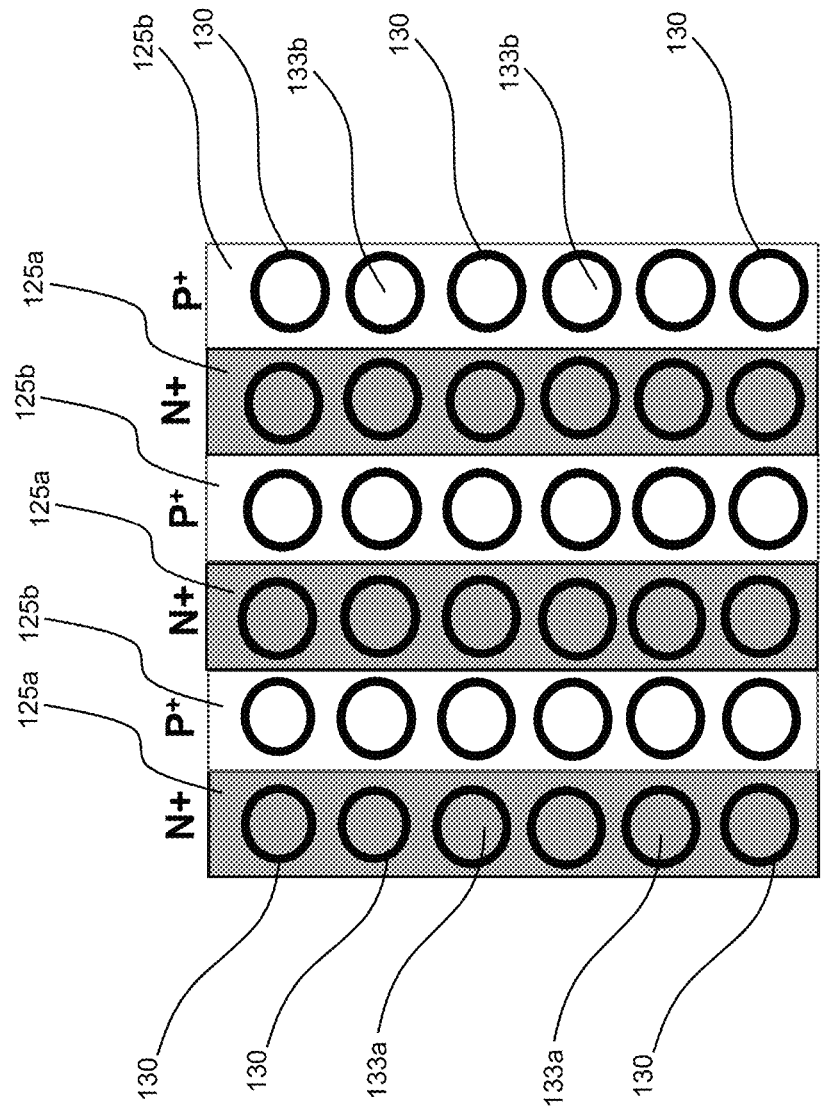

Trenches 130 are then formed in the stacks 125a of n+ doped regions and in the stacks 125b of p+ doped regions. The trenches 130 are for example formed as cylindrical shells. The trenches 130 extend down to the layer of oxide 110. Multiple trenches 130 are formed along each stack 125a and 125b, that are strip-like shaped, as shown in FIG. 1E. Each trench 130 delimits a respective (e.g., cylindrical) portion 133a of a respective stack 125a of n+ doped regions or a respective (e.g., cylindrical) portion 133b of a respective stack 125b of p+ doped regions, which portions 133a and 133b remain separated from the rest of the respective stack 125a of n+ doped regions and stack 125b of p+ doped regions. The (e.g., cylindrical) portions 133a and 133b of the stacks 125a of n+ doped regions and of the stacks 125b of p+ doped regions will form the thermoelectrically active elements (e.g., the "legs") of the thermoelectric converter.

By means of an oxidation process the trenches 130 are filled with oxide and the top surface of the structure (e.g., the surface opposite to the Silicon substrate 105) is covered by an oxide layer 135. The oxide can for example be $SiO_2$. In particular, the oxidation process can involve a thermal oxidation process for coating the lateral walls of the trenches 130 with oxide, followed by a deposition of a thick oxide layer using TEOS (TetraEthyl OrthoSilicate) filling the trenches and covering the surface of the structure with the oxide layer 135. The resulting structure is shown in FIG. 1F. In this way, the (e.g., cylindrical) portions of the stacks 125a of n+ doped regions and of the stacks 125b of p+ doped regions which are delimited by the trenches 130 remain insulated from the remaining of the respective stacks 125a of n+ doped regions and stacks 125b of p+ doped regions. As mentioned, the (e.g., cylindrical) portions of the stacks 125a of n+ doped regions and of the stacks 125b of p+ doped regions which are delimited by the trenches 130 will form the thermoelectric elements (e.g., the "legs") 133a (n doped, e.g., having a first Seebeck coefficient, particularly of a first sign, e.g., positive) and 133b (p doped, e.g., having a second, different Seebeck coefficient, particularly of an opposite sign, e.g., negative) of the thermoelectric converter.

Figure 1G:
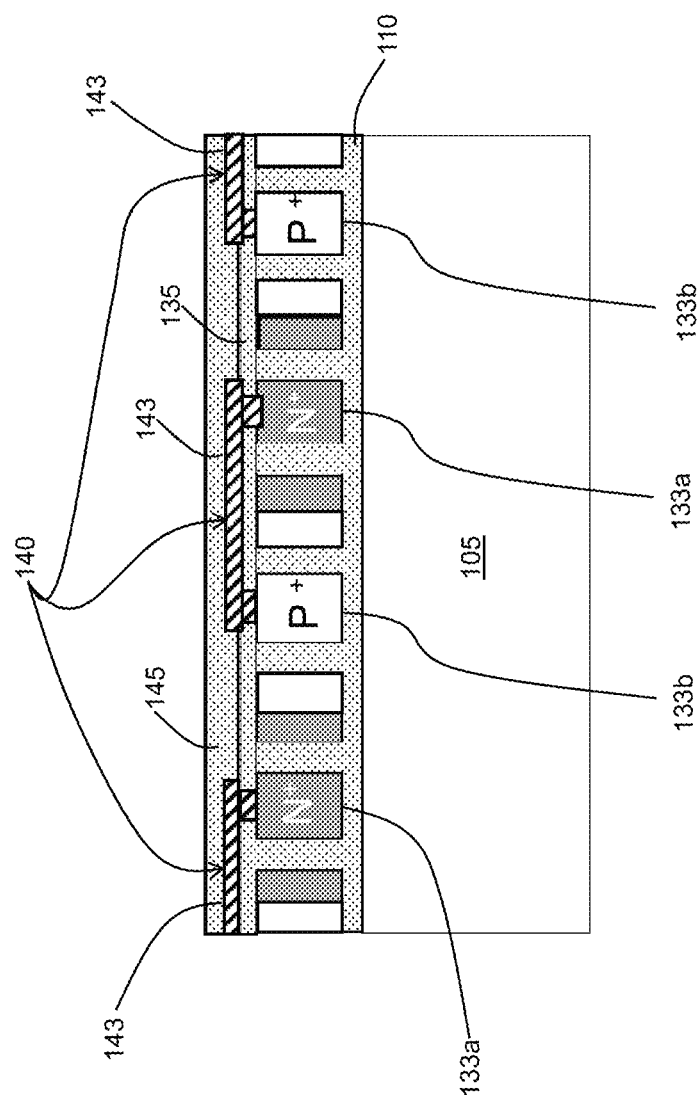

As visible in FIG. 1G, contact openings are formed in the oxide layer 135 in correspondence of the n+ doped thermoelectric elements 133a and of the p+ doped thermoelectric elements 133b delimited by the trenches 130, and a conductive layer 140, e.g., of a metal, is formed on the oxide layer 135 and then patterned to define conductive lines 143 interconnecting the n+ doped thermoelectric elements 133a and the p+ doped thermoelectric elements 133b. The surface of the structure is then covered by a layer 145 of oxide, e.g., $SiO_2$.

Reference is now made to 2A-2L, which show some steps of a method according to another example embodiment of the present disclosure.

Starting from a Silicon substrate (first Silicon wafer) 205, a surface of the Silicon substrate 205 is oxidized to form a layer of oxide 210, e.g., Silicon dioxide ($SiO_2$).

Then, a (relatively thick) layer 215 of polycrystalline Silicon ("epi-poly") is formed over the layer of oxide 210. The layer 215 of polycrystalline Silicon is for example formed by means of epitaxial growth in an epitaxial reactor.

Figure 2A:
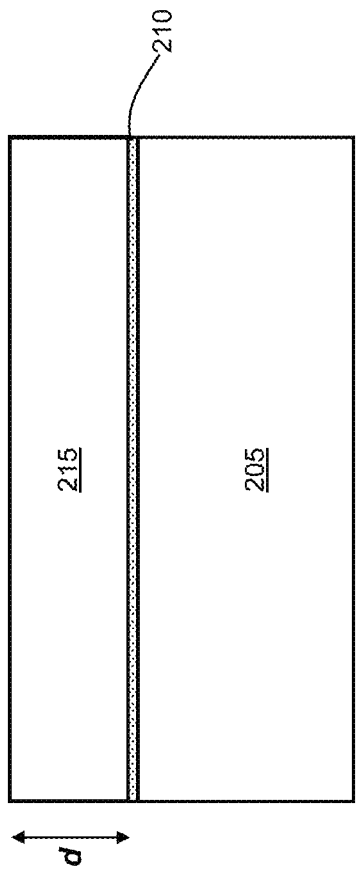

The resulting structure is depicted in FIG. 2A.

The thickness d of the layer 215 of polycrystalline Silicon should be such as to ensure a sufficient thermal difference between the bottom and the top of the thermoelectric elements that will be formed therewithin (as described in the following), even for relatively low ambient temperature gradients. For example, the thickness of the layer 215 can be of some tens of microns, particularly from about 10 μm to about 30 μm.

Figure 2B:
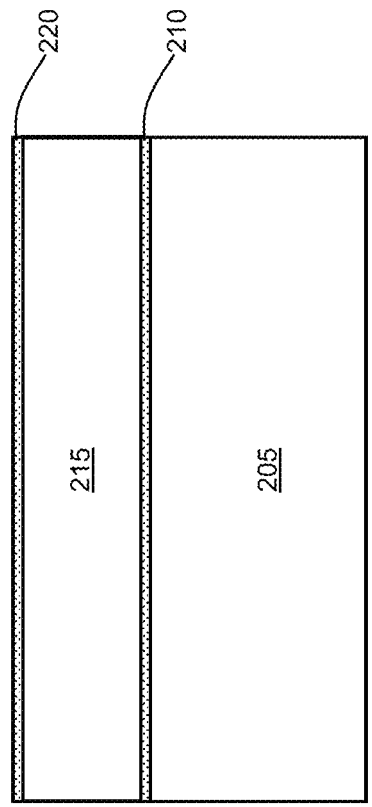

A surface of the layer 215 of polycrystalline Silicon is then oxidized to form a layer 220 of oxide, for example a layer of Silicon dioxide ($SiO_2$). The resulting structure is shown in FIG. 2B.

Figure 2C:
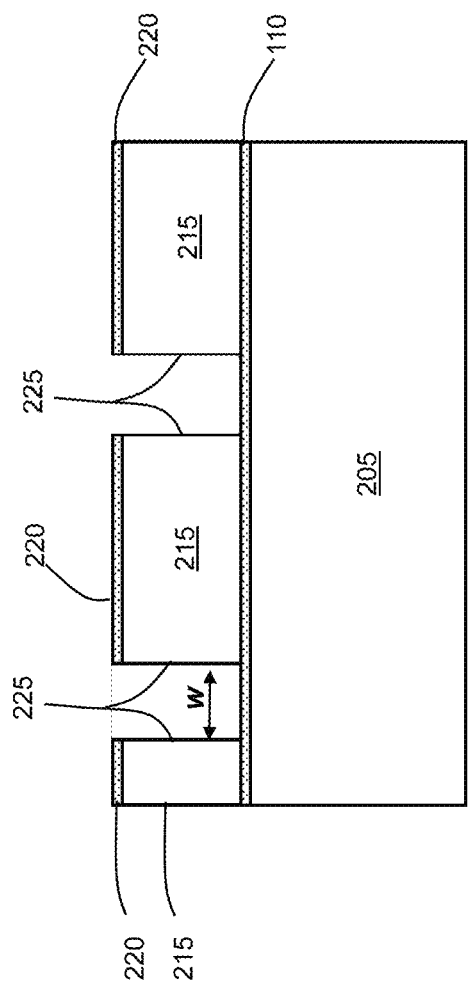

As shown in FIG. 2C, trenches 225 are then formed in the layer 215 of polycrystalline Silicon. The trenches 225 extend down to the layer of oxide 210 that covers the surface of the Silicon substrate 205. The trenches 225 may for example be cylindrical. The trenches 225 may for example have a width w of about 3 μm.

Figure 2D:
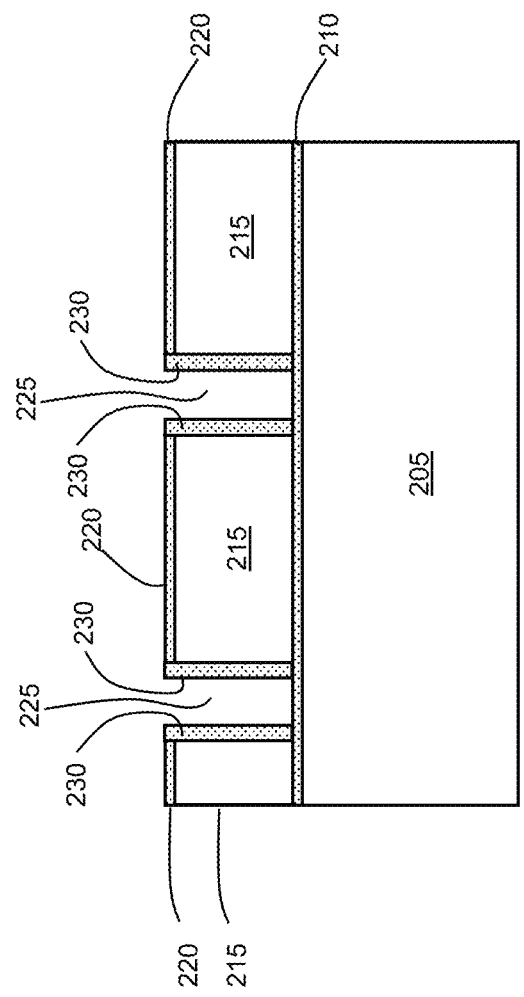

The walls of the trenches 225 are then covered by a layer of oxide 230, e.g., a layer of Silicon dioxide ($SiO_2$), as depicted in FIG. 2D, e.g., by means of thermal oxidation. In this way, cylindrical shells of oxide 230 are created inside the trenches 225.

A layer 235 of n+ doped polycrystalline SiGe is formed over the surface of the structure (e.g., the surface opposite to the Silicon substrate 205). The layer 235 of n+ doped polycrystalline SiGe is for example a layer of n+ doped polycrystalline $Si_{0.7}Ge_{0.3}$ polysilicon. The layer 235 of n+ doped polycrystalline SiGe can for example be formed by means of deposition, particularly chemical deposition, even more particularly Chemical Vapor Deposition (CVD); among the several different CVD techniques, Low Pressure CVD (LPCVD) can be exploited. Deposition takes place from silane ($SiH_4$) and germane ($GeH_4$). The n+ doped polycrystalline SiGe is conformal. During the deposition process, n+ doped polycrystalline SiGe fills the trenches 225 (with walls covered by the oxide 230). The resulting structure is shown in FIG. 2E.

By means of a Chemical-Mechanical Polishing ("CMP") step, the layer 235 of n+ doped polycrystalline SiGe is removed from over the surface of the layer 220 of oxide, leaving only (e.g., cylindrical) portions 237 of the n+ doped polycrystalline SiGe within the trenches 225 (with walls covered by the oxide 230), as depicted in FIG. 2F.

Figure 2G:
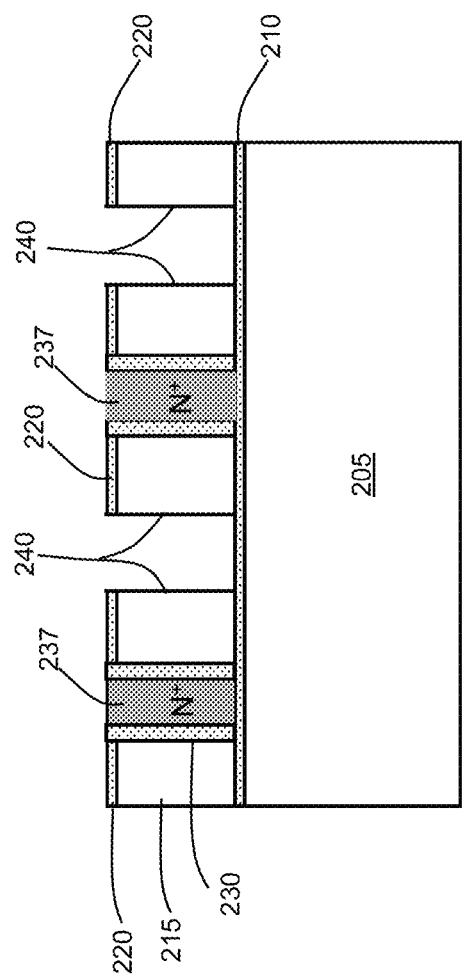

Further trenches 240 are then formed in the layer 215. Like the trenches 225, the further trenches 240 extend down to the layer of oxide 210 covering the surface of the Silicon substrate 205. The further trenches 240 may for example be cylindrical. Like the trenches 225, the trenches 240 may for example have a width of about 3 μm. The further trenches 240 are formed so as to obtain a structure, shown in FIG. 2G, in which the further trenches 240 are alternated with the trenches 225.

Figure 2H:
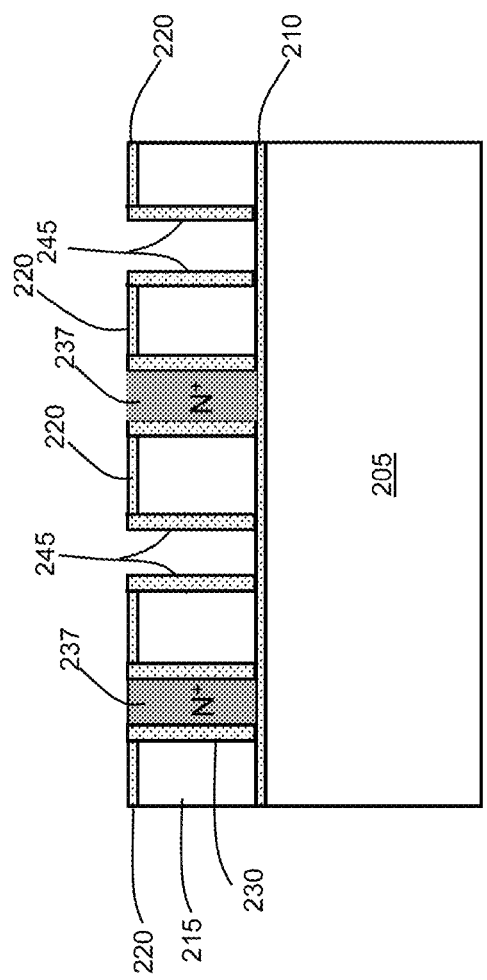

The walls of the further trenches 240 are then covered by a layer of oxide 245, e.g., a layer of Silicon dioxide ($SiO_2$), for example by means of a thermal oxidation process, as depicted in FIG. 2H. In this way, cylindrical shells of oxide 245 are created inside the trenches 240.

Figure 2I:
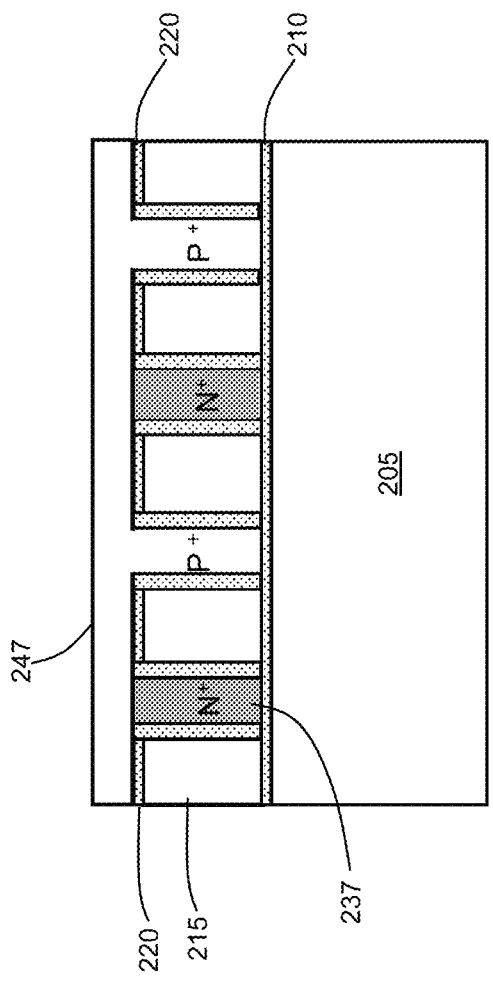

A layer 247 of p+ doped polycrystalline SiGe is formed over the surface of the structure. The layer 247 of p+ doped polycrystalline SiGe is for example a layer of p+ doped polycrystalline $Si_{0.7}Ge_{0.3}$. The layer 247 of p+ doped polycrystalline SiGe can for example be formed by means of deposition, particularly chemical deposition, even more particularly Chemical Vapor Deposition (CVD); among the several different CVD techniques, Low Pressure CVD (LPCVD) can be exploited. Deposition takes place from silane ($SiH_4$) and germane ($GeH_4$). The p+ doped polycrystalline SiGe is conformal. During the deposition process, p+ doped polycrystalline SiGe fills the further trenches 240 (with walls covered by the oxide 245). The resulting structure is shown in FIG. 2I.

Figure 2J:
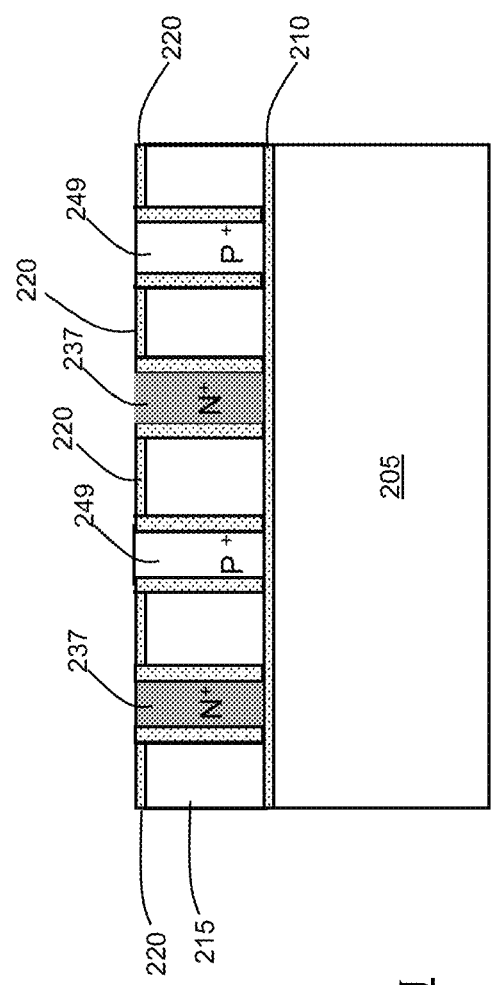

By means of a Chemical-Mechanical Polishing ("CMP") step, the layer 247 of p+ doped polycrystalline SiGe is removed from over the surface of the layer 220 of oxide, leaving only (e.g., cylindrical) portions 249 of the p+ doped polycrystalline SiGe within the further trenches 240 (with walls covered by the oxide 245), as depicted in FIG. 2J.

In this way, the (e.g., cylindrical) portions 237 of n+ doped polycrystalline SiGe and the (e.g., cylindrical) portions 249 of p+ doped polycrystalline SiGe which are delimited by the trenches 225 and 245 (with walls covered by the oxide 230 and 245) remain insulated from the surrounding layer 215 of polycrystalline Silicon. These (e.g., cylindrical) portions 237 of n+ doped polycrystalline SiGe and portions 249 of p+ doped polycrystalline SiGe will form the thermoelectric elements (e.g., the "legs") of the thermoelectric converter.

It is pointed out that each of the portions 237 of n+ doped polycrystalline SiGe and each of the portions 249 of p+ doped polycrystalline SiGe which are visible in FIG. 2J may identify a respective array of portions 237 of n+ doped polycrystalline SiGe (each one formed inside a respective trench 225 with walls covered by the oxide 230) and a respective array of portions 249 of n+ doped polycrystalline SiGe (each one formed inside a respective further trench 240 with walls covered by the oxide 245), extending along a direction orthogonal to the plane of the drawing sheet of FIG. 2J (as can be clearly understood looking at FIG. 5, to be described later on).

The surface of the structure (opposite to the Silicon substrate 205) is then oxidized, to form a layer of oxide 250, e.g., a layer of Silicon dioxide ($SiO_2$), covering the whole surface of the structure, as shown in FIG. 2K.

As visible in FIG. 2L, contact openings are formed in the oxide layer 250 in correspondence of each of the portions 237 of n+ doped polycrystalline SiGe and each of the portions 249 of p+ doped polycrystalline SiGe, and a conductive layer 255, e.g., of a metal, is formed on the oxide layer 250 and then patterned to define first conductive lines 257 interconnecting the thermoelectric elements 235 and 245. The surface of the structure is then covered by a further oxide layer 260, e.g., SiO$_2$. Oxide layers 250 and 260 form, together a surface oxide layer 270 embedding the first conductive lines 257.

In an alternative embodiment, the thermoelectric elements 235 and 245, instead of being made of n+ doped and p+ doped polycrystalline SiGe, respectively, can be made of n-doped and p-doped porous Silicon, respectively. As mentioned in the foregoing, porous Silicon has an advantageously small thermal conductivity (0.15-1.5 W/m K for porosity ~75%). The n-doped and p-doped porous Silicon thermoelectric elements 235 and 245 can be obtained by converting n$^+$ and p$^+$ doped polycrystalline Silicon, respectively.

FIGS. 3A-3I depicts some steps of a process for forming the thermoelectric elements 235 and 245 made of porous Silicon.

Figure 3A:
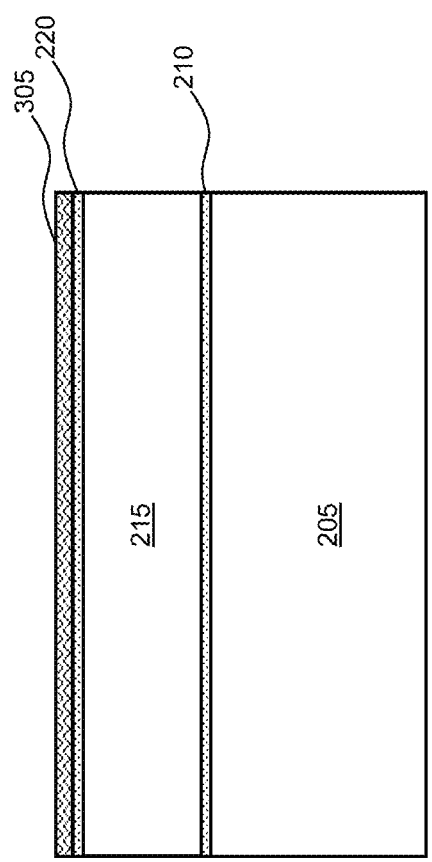

Starting from the structure shown in FIG. 2B, a mask layer 305 (e.g., a Silicon nitride layer or a thick oxide layer) is formed over the layer 220 of oxide, as depicted in FIG. 3A.

Figure 3B:
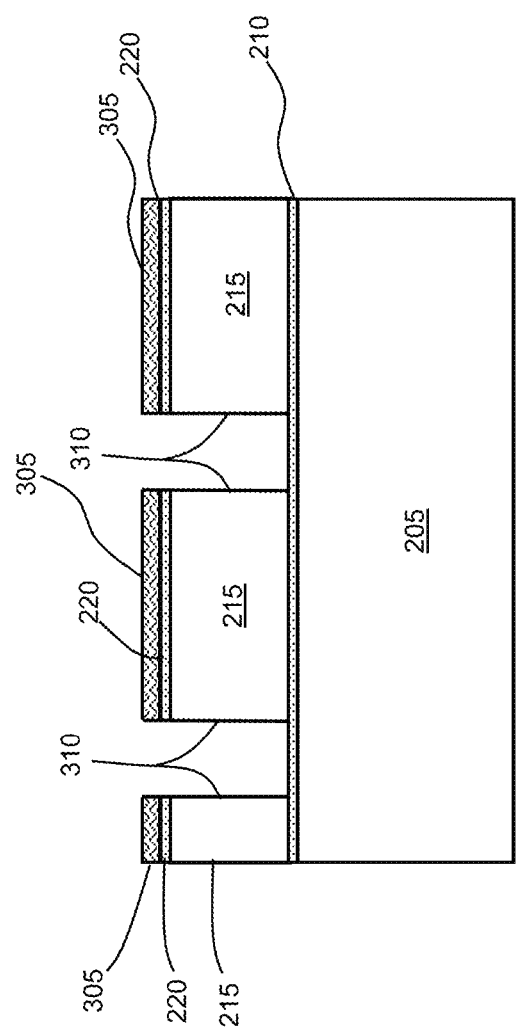

As shown in FIG. 3B, trenches 310 are then formed by selective etching, which trenches 310, starting from the surface of the mask layer 305 (that protects the structure from etching where tranches are not to be formed), extend down to the layer of oxide 210 that covers the Silicon substrate 205. The trenches 310 can be similar to the trenches 225 of the previously described embodiment (for example, cylindrical trenches having a width of about 3 μm.).

Figure 3C:
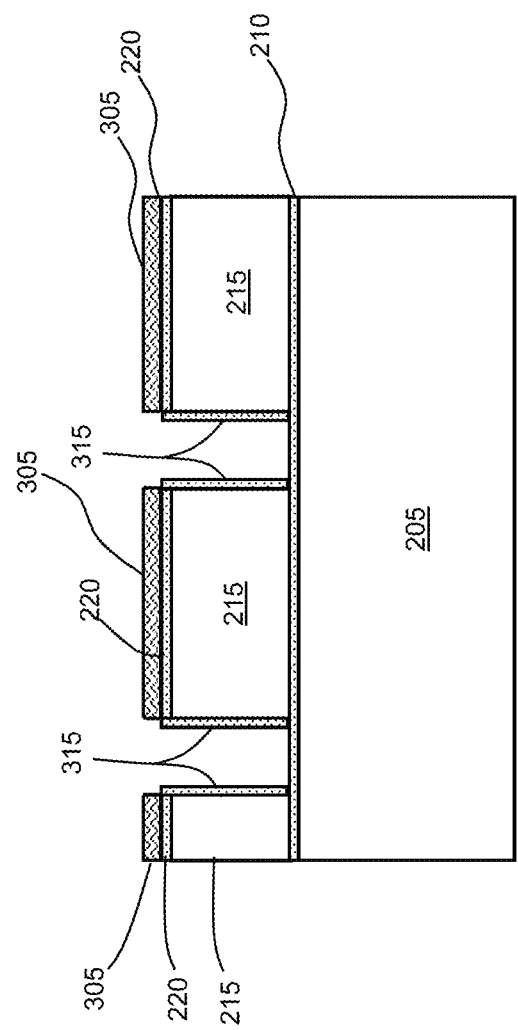

As depicted in FIG. 3C, the walls of the trenches 310 are then coated by a layer of oxide 315, for example by means of a thermal oxidation process.

Figure 3D:
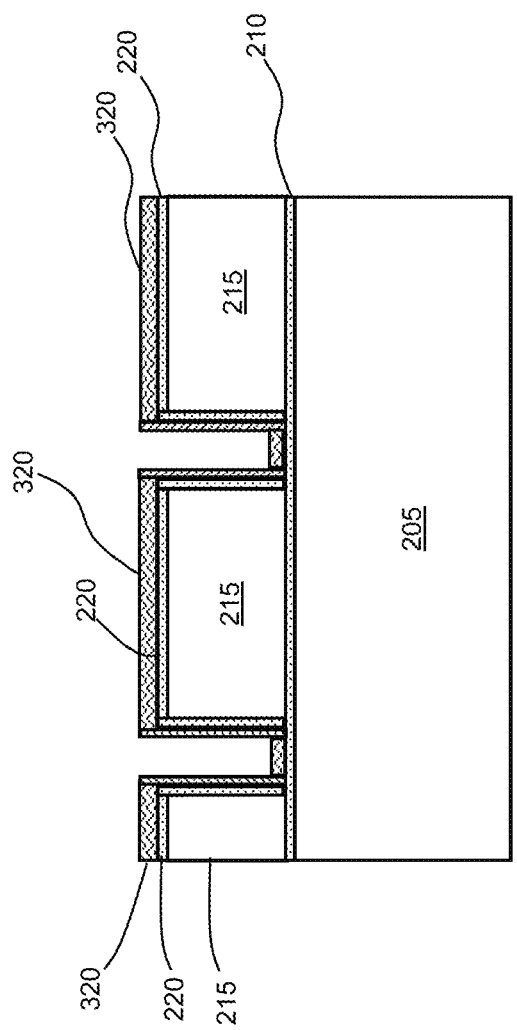

As shown in FIG. 3D, a mask layer 320 of, e.g., Silicon nitride is then deposited over the whole structure. The material of the mask layer 320 penetrates into the trenches 310 and coats the walls and the bottom of the trenches 310.

Moving to FIG. 3E, the structure is subjected to an etch process during which part of the mask layer 320 is etched away; the etch stops when the material of the mask layer 320 and the portion of the layer of oxide 210 at the bottom of the trenches 310 are removed, thereby leaving the Silicon substrate 205 exposed at the bottom of the trenches 310.

Process steps similar to those shown in FIGS. 2E-2J are then performed to fill the trenches 310 with n+ and p+ doped polycrystalline Silicon.

Figure 3F:
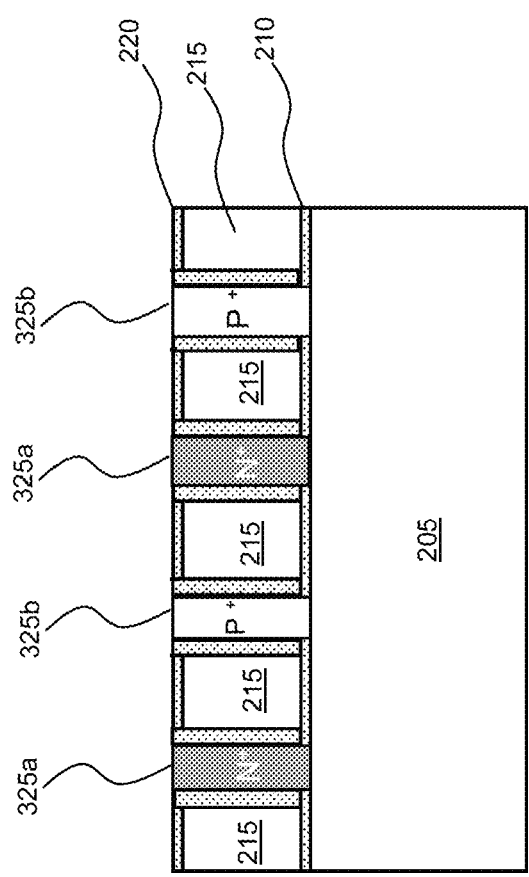

After a chemical-mechanical polishing step, the structure depicted in FIG. 3F is obtained (in this and in the following figures the layer of Silicon nitride which, after the etch of step 3E, remains at the top surface and on the lateral walls of the trenches 310, is not shown for the sake of better intelligibility). The trenches 310 are filled with (e.g., cylindrical) pillars 325a and 325b of n+ and p+ doped polycrystalline Silicon, respectively.

The pillars 325a and 325b of n+ and p+ doped polycrystalline Silicon are then converted into pillars of n+ and p+ doped porous Silicon. To this purpose, the structure is immersed in a tank or anodization cell, e.g., made of Teflon, filled with a solution of hydrofluoric (HF) acid and provided with an anode and a cathode. The structure to be processed is connected to the anode (the cathode can for example be a mesh electrode made of Platinum). The HF acid affects the pillars 325a and 325b of n+ and p+ doped polycrystalline Silicon, transforming them into pillars of n+ and p+ doped porous Silicon. Preferably, the process is stopped before the bottom portions (base) of the pillars 325a and 325b of n+ and p+ doped polycrystalline Silicon are transformed into porous Silicon. This ensures that the integrity of the porous silicon is preserved during the subsequent phases of the fabrication process. The resulting structure is depicted in FIG. 3G, where references 330a and 330b denotes the pillars of n+ and p+ doped porous Silicon, respectively, and reference 335 denotes the bottom portions of the pillars 330a and 330b that have not undergone the transformation into porous Silicon.

It is pointed out that in embodiments the steps for the conversion of the pillars 325a and 325b of n+ and p+ doped polycrystalline Silicon into pillars of n+ and p+ doped porous Silicon can be avoided: the Applicant has found that n+ and p+ doped polycrystalline Silicon is also a viable choice as a thermoelectric material, even if less performing than n+ and p+ doped porous Silicon.

Figure 3H:
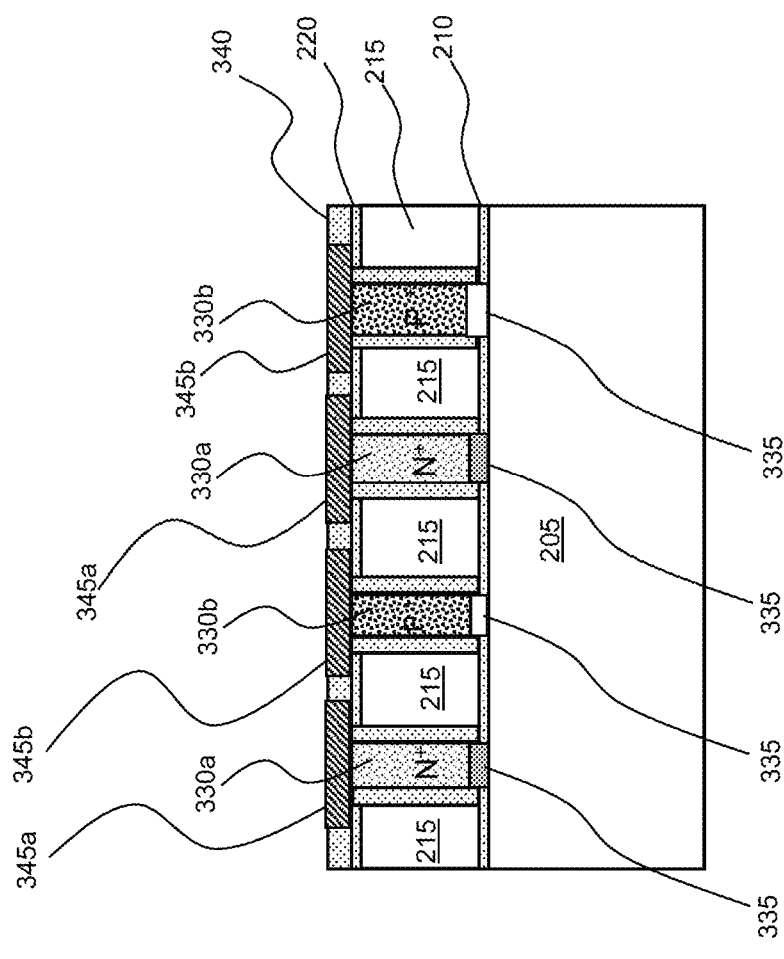
Figure 3I:
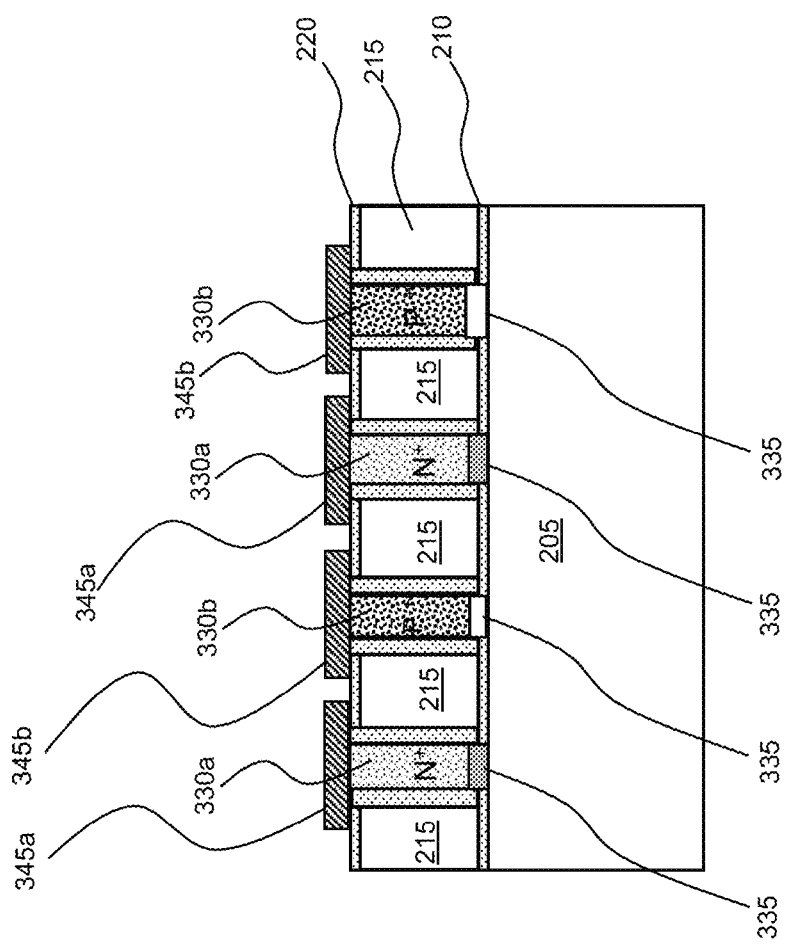

In embodiments, the process may envisage the formation (e.g., by deposition) of a layer of polycrystalline Silicon 340 over the surface of the structure. Donor and acceptor dopant ions are then selectively implanted into the polycrystalline Silicon 340 to form n+ and p+ doped polycrystalline Silicon areas 345a and 345b over the pillars of n+ and p+ doped porous Silicon 330a and 330b, respectively. The resulting structure is depicted in FIG. 3H. The remaining portions of the layer of polycrystalline Silicon 340 (other than the n+ and p+ doped polycrystalline Silicon areas 345a and 345b) are then etched away, to obtain the structure depicted in FIG. 3I. In this way, the n+ and p+ doped polycrystalline Silicon areas 345a and 345b over the pillars of n+ and p+ doped porous Silicon 330a and 330b provide enlarged contact areas to the pillars of n+ and p+ doped porous Silicon 330a and 330b that may facilitate the formation of electrical contacts to the pillars. Similar considerations may apply to the first two embodiments described in the foregoing.

FIGS. 4A to 4E show some steps of a method according to an example embodiment of the present disclosure for proceeding with the fabrication of the thermoelectric converter of any one of the previously described embodiments. Despite the steps of the fabrication method which will be described hereafter apply as well to any of the embodiments described so far, for mere reasons of simplicity they will be described and shown making reference to the second embodiment described in FIGS. 2A-2L.

Figure 4A:
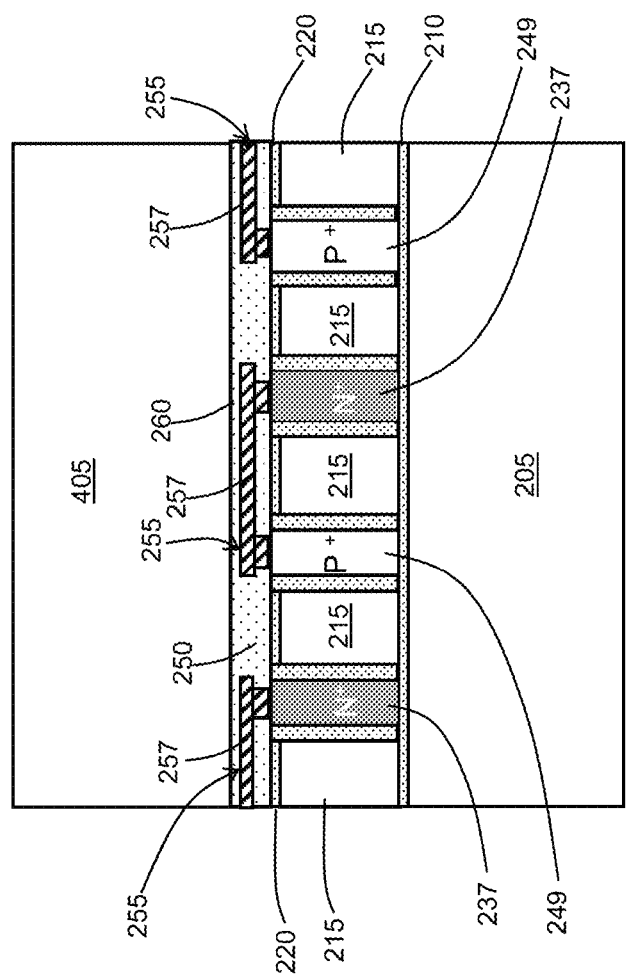
FIGS. 4A-4E show some steps of the fabrication method following the steps of FIGS. 2A-2L or FIGS. 3A-3I, in an example embodiment of the present disclosure (same or similar process steps can also follow the steps of FIGS. 1A-1G)

As shown in FIG. 4A, starting from the structure of FIG. 2L, a second Silicon wafer 405 is bonded to the surface of the structure opposite to the Silicon substrate (first Silicon wafer) 205.

Figure 4B:
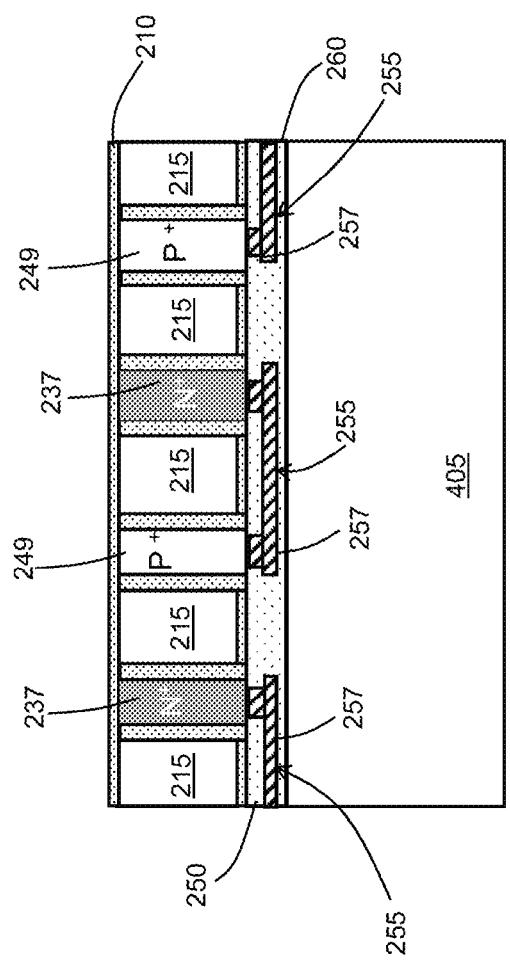
Figure 4C:
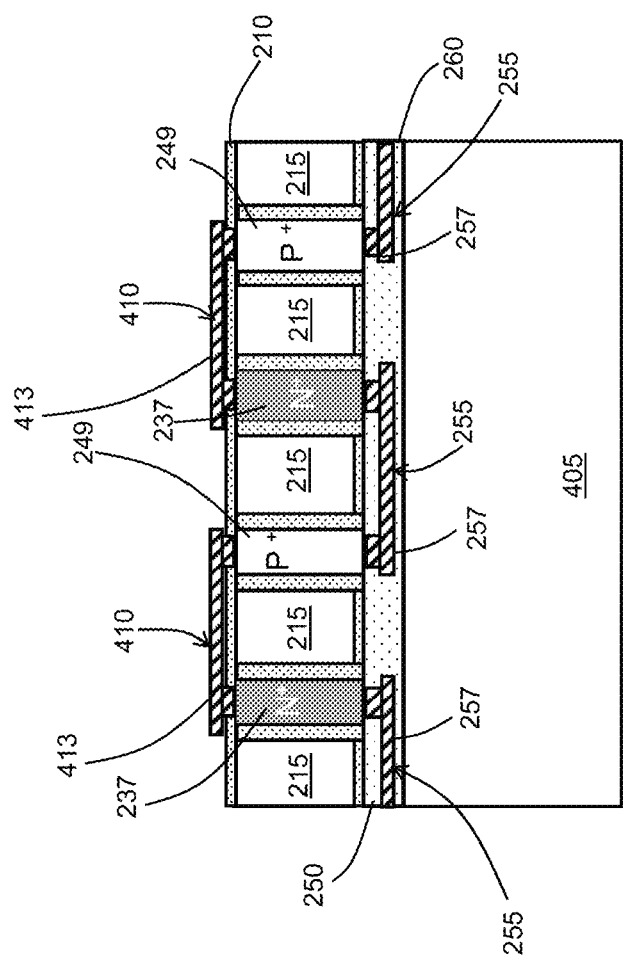

The Silicon substrate (first Silicon wafer) 205 is then removed, as shown in FIG. 4B (in which figure, as well as in the following figures FIG. 4C and FIG. 4D, the structure is depicted upside-down compared to FIG. 4A). After removal of the Silicon substrate (first Silicon wafer) 205, the layer 210 of oxide remains uncovered.

Contacts openings are formed in the layer 210 of oxide in correspondence of the thermoelectric elements 237 and 249, and a conductive layer 410, e.g., of a metal, is formed on the oxide layer 210 and then patterned to define second conductive lines 413 interconnecting the thermoelectric elements 237 and 249. The resulting structure is shown in FIG. 4C.

Figure 4D:
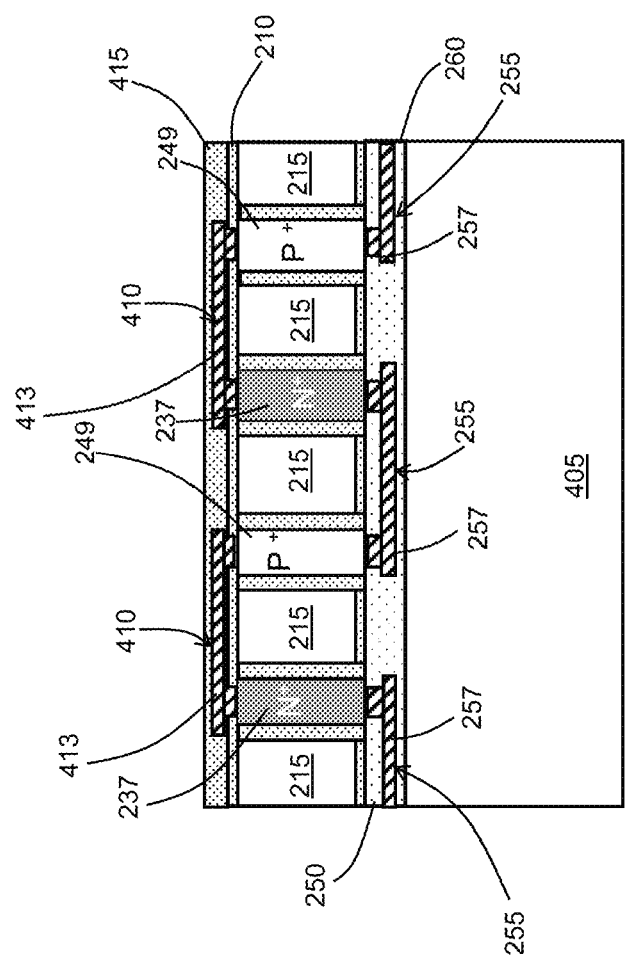

The surface of the structure is then covered by a further layer 415 of oxide, e.g., SiO$_2$, obtaining the structure of FIG. 4D.

Figure 4E:
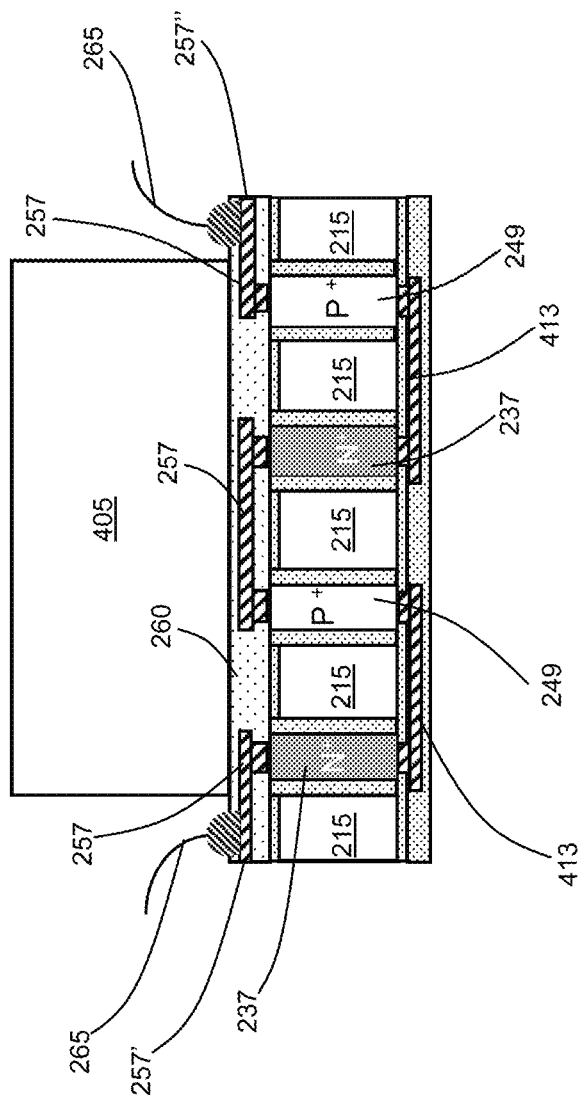

The second Silicon wafer 405 is then selectively etched to form trenches, leaving the material of the second Silicon wafer only over the thermoelectric elements 237, 249, and, where the second Silicon wafer 405 is removed, the oxide layer 260 that covered the first conductive lines 257 is etched and removed to leave portions 257', 257" of the first conductive lines 257 exposed; the exposed portions 257', 257" of the first conductive lines 257 will form contact pads of the thermoelectric converter, for soldering bonding wires 265 (similar portions of the conductive lines 143 in the structure of FIG. 1G will form the contact pads). The resulting structure is shown in FIG. 4E (oriented similarly to FIGS. 2A-2L).

The side of the structure where there is the (portion of the) second Silicon wafer 405 (left and not removed) will, in use, be for example the "hot" side of the thermoelectric converter (e.g., the side where the temperature of the environment where the thermoelectric converter is inserted is higher), while the opposite side of the structure will, in use, be for example the "cold" side of the thermoelectric converter (e.g., the side where the temperature of the environment where the thermoelectric converter is inserted is lower). Naturally, in use the role of the "hot" and "cold" sides of the thermoelectric converter can be reverted: generally, the two sides of the thermoelectric converter will in use experiment a temperature gradient. The portion(s) of the second Silicon wafer 405 left and not removed can form a structural support for the device.

Figure 4F:
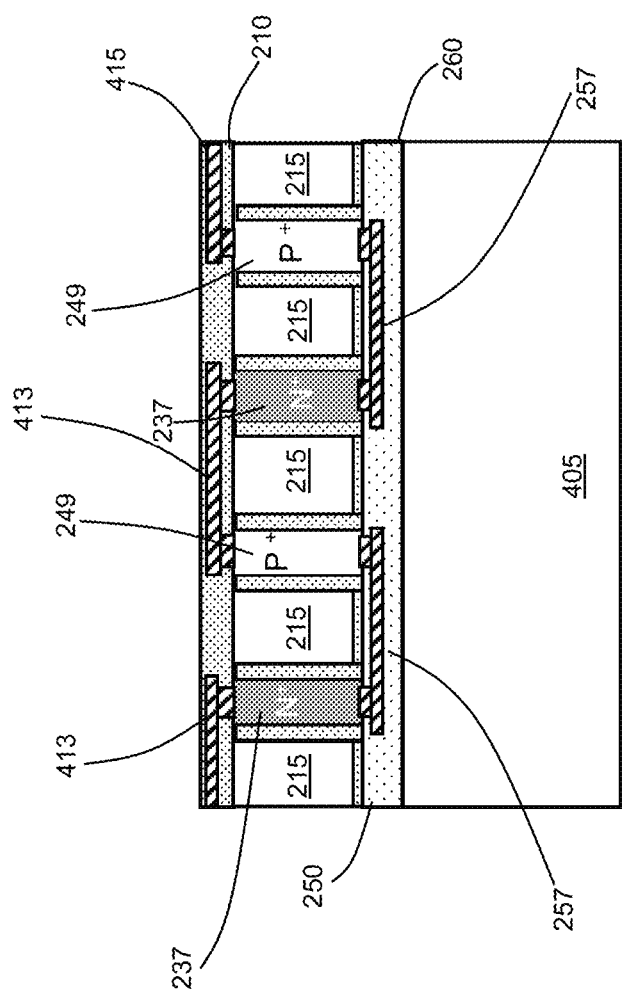
FIG. 4F shows example steps for the formation of contact pads.

FIG. 4F shows an alternative to steps 4D and 4E for the formation of contact pads for the bonding wires 265. In this case, the contact pads can be portions of the second conductive lines 413 interconnecting the thermoelectric elements 237 and 249. To open contact areas for the contact pads, the layer 415 of oxide is selectively etched. It is not necessary to selectively etch the second Silicon wafer 405, which can be left as it is for acting as a mechanical support for the structure.

FIG. 5 shows the layout of the structure obtained by the fabrication process of FIGS. 1A-1G and subsequent steps like those shown in FIGS. 4A-4E. The device comprises a plurality of first thermoelectric elements 133a (n doped, e.g., having a first Seebeck coefficient, particularly of a first sign, e.g., positive) and a plurality of second thermoelectric elements 133b (p doped, e.g., having a second, different Seebeck coefficient, particularly of an opposite sign, e.g., negative). Each first thermoelectric element and each second thermoelectric element has a first end at the "hot" side of the device and a second end at the "cold" side of the device. The first and second thermoelectric elements 133a and 133b are arranged in alternated arrays that extend parallel to each other and are contacted (at the opposite ends of the thermoelectric elements, "hot" side and "cold" side") by the conductive lines 143 (here forming first conductive lines 257) and second conductive lines 413, in "zig-zag" fashion. The first conductive lines 257 have an input contact pad 257' and an output contact pad 257".

The first and second thermoelectric elements 133a and 133b are thermally in parallel and electrically in series.

Figure 6:
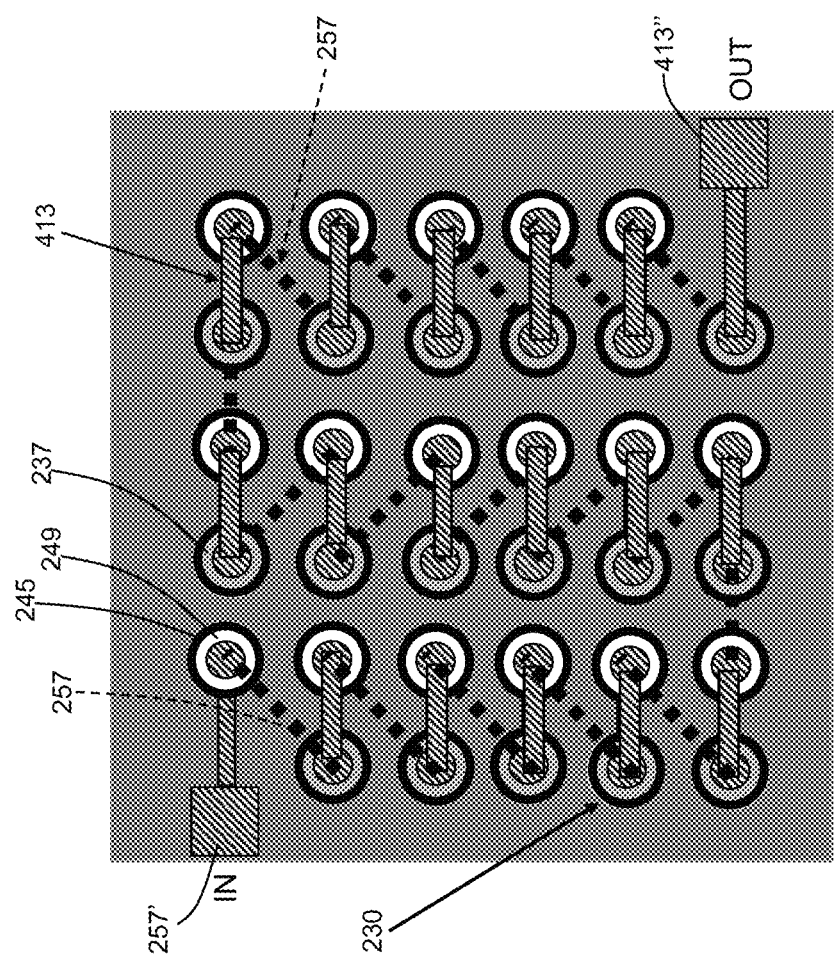
FIG. 6 show, in top plan view, a layout of a thermoelectric converter obtained by a method according to the embodiment of the present disclosure, including steps shown in FIGS. 2A-2L or FIGS. 3A-3I and FIGS. 4A-4E.

FIG. 6 shows the layout of the structure obtained by the fabrication process of FIG. 2A-2L (or 3A-3I) and 4A-4D and 4F.

Therefore, the device of FIG. 6 comprises a plurality of first thermoelectric elements 237 (n doped, e.g., having a first Seebeck coefficient, particularly of a first sign, e.g., positive) and a plurality of second thermoelectric elements 249 (p doped, e.g., having a second, different Seebeck coefficient, particularly of an opposite sign, e.g., negative). Each first thermoelectric element 237 and each second thermoelectric element 249 has a first end at the "hot" side of the device and a second end at the "cold" side of the device. The first and second thermoelectric elements 237 and 249 are arranged in alternated rows or arrays that extend parallelly to each other and are contacted (at the opposite ends of the thermoelectric elements, "hot" side and "cold" side") by the first conductive lines 257 and the second conductive lines 413, in "zig-zag" fashion. The second conductive lines 413 have an input contact pad 413' and an output contact pad 413".

The first and second thermoelectric elements 237 and 249 are thermally in parallel and electrically in series.

Figure 7:
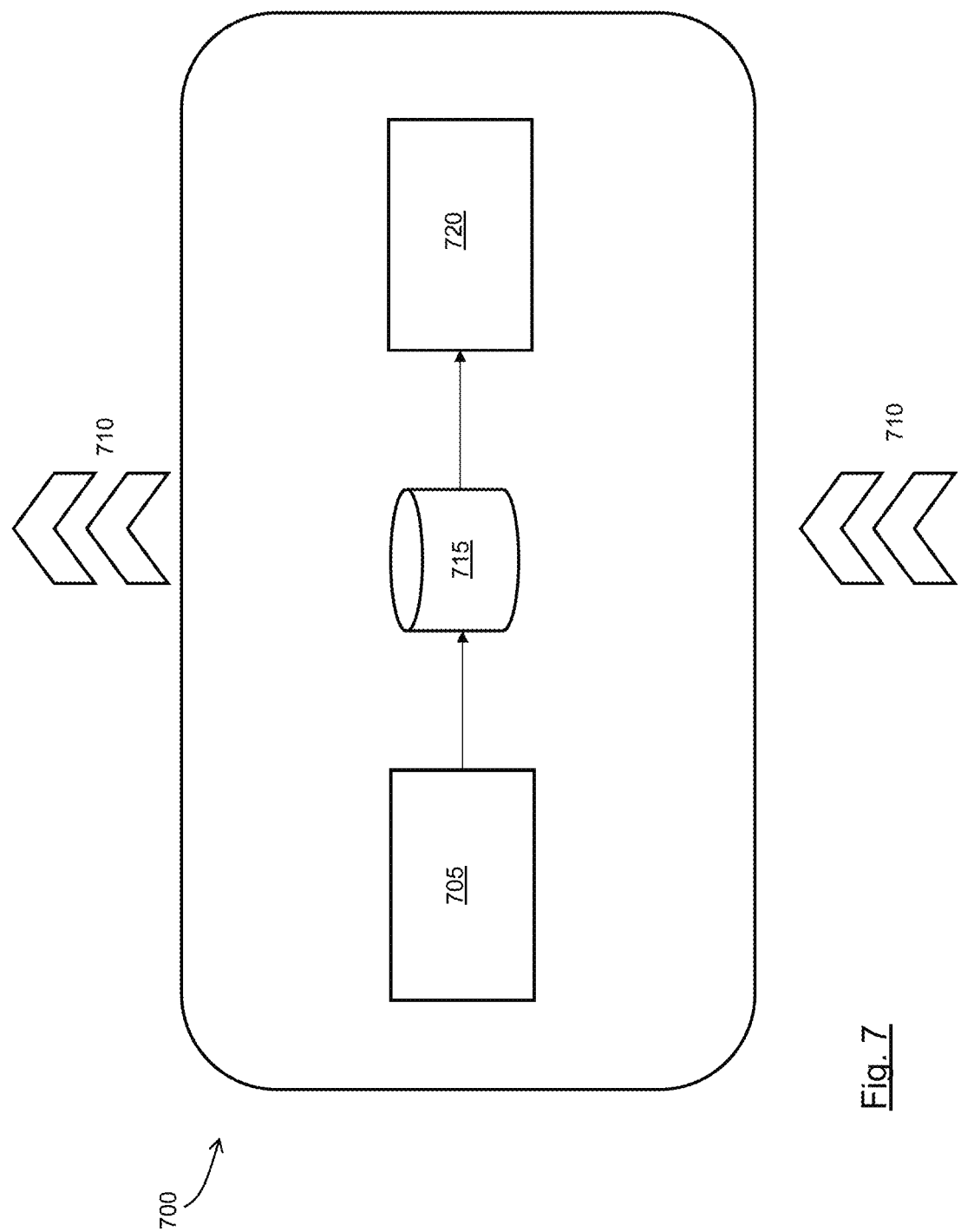
FIG. 7 shows a simplified block diagram of an electronic system comprising a thermoelectric converter according to an embodiment of the present disclosure.

FIG. 7 schematically shows in terms of a simplified block diagram an electronic system 700 comprising a thermoelectric converter according to an embodiment of the present disclosure.

The system 700 comprises a thermoelectric converter 705, for example a thermoelectric generator, adapted to convert heat, represented by the arrows 710, in an environment in which the system 700 is located, into electric energy which is exploited to charge a battery 715 of the system 700. The battery 715 supplies electric energy to an application 720, e.g., an electronic subsystem such as a smart watch, a wearable device, a torch, and so on.

The proposed solution exhibits several advantages. It is easy to industrialize, provides power levels of the order of mA, has a low consumption of semiconductor area, and works with low or high temperature differences. Moreover, the proposed solution allows the size of standard thermoelectric devices to be reduced from macroscale to microscale and exploiting technological steps typical of semiconductor (Silicon) manufacturing technology.

The thermoelectric converter according to the present disclosure can be exploited in several practical applications, such as wearable and fitness gears, pedometers and heart-rate meters, smart watches and wrist bands, wireless sensor nodes for smart homes and cities, as well as in other energy harvesting systems, as discussed below with reference to FIG. 17.

Furthermore, the thermoelectric converter according to the present disclosure may be used in solar energy recovery devices, as disclosed herein.

FIGS. 8 to 13 show some steps of a method according to an example embodiment of the present disclosure for manufacturing a solar energy recovery device using the thermoelectric converter of any one of the previously described embodiments. Despite the steps of the fabrication method which will be described hereafter apply as well to any of the embodiments described so far, for simplicity they will be described and shown as a continuation of the process steps described with reference to FIGS. 4A to 4D and 4F. In the cross-sections of FIGS. 8, 10 (taken along cross-section plane VIII-VIII of FIGS. 9A, 9B) and in the cross-section of FIG. 11 (taken along cross-section plane XI-XI of FIGS. 12A, 12B), only the first conductive lines 257 are completely visible; second conductive lines 413 are visible only in part.

Figure 8:
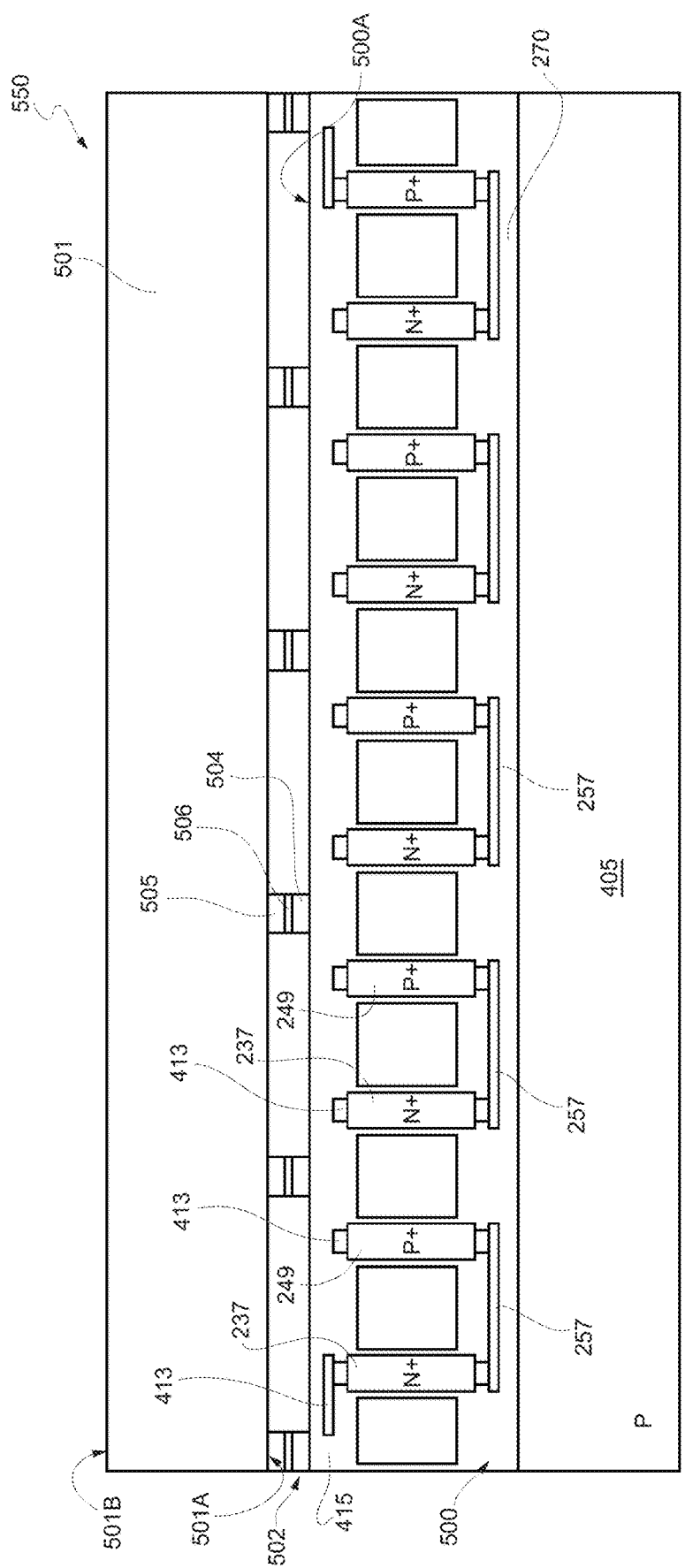
FIG. 8 shows a cross-section, taken along section line VIII-VIII of FIGS. 9A and 9B, of a solar energy recovery device using the thermoelectric converter of FIG. 4F, after bonding the thermoelectric wafer and a solar cell wafer.

As shown in FIG. 8, a third silicon wafer 501 is bonded to a surface 500A of the structure of FIG. 4F, here denoted by 500 and also called thermoelectric generator structure 500; surface 500A is opposite to the second silicon wafer 405. The third silicon wafer 501 may be a silicon wafer, in particular monocrystalline silicon, doped with acceptor dopants, thus of P type, and has a first surface 501A and a second surface 501B. The third silicon wafer 501 is bonded to thermoelectric generator structure 500 at its first surface 501A.

To this end, a bonding multilayer 502 is used; for example, bonding multilayer 502 may include a first bonding layer 504 extending on surface 500A of thermoelectric generator structure 500; a second bonding layer 505 extending on first surface 501A of the third silicon wafer 501; and an intermediate bonding layer 506. The material of the first bonding layer 504 and of the second bonding layer 505 may be copper (Cu); the material of intermediate bonding layer 506 may be tin (Sn).

The first bonding layer 504, the second bonding layer 505 and the intermediate bonding layer 506 may be applied on either the surface 500A of thermoelectric generator structure 500 or on the first surface 501A of the third silicon wafer 501. In the alternative, the first bonding layer 504 may be applied to the surface 500A of thermoelectric generator structure 500, the second bonding layer 505 may be applied to the first surface 501A of the third silicon wafer 501 and the intermediate bonding layer 506 may be applied on one of the latter.

Figures 9A, 9B:
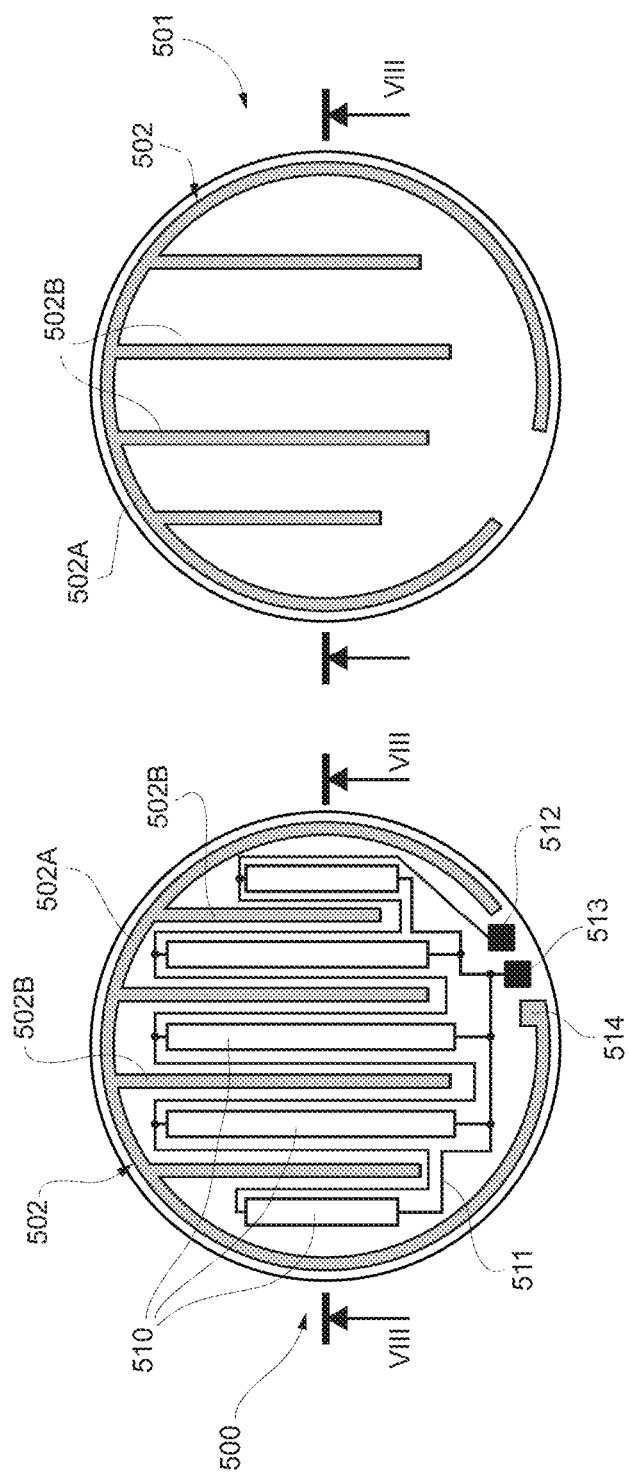
FIG. 9A is a top plan view of the thermoelectric wafer of FIG. 8, before bonding.
FIG. 9B is a bottom plan view of the solar cell wafer of FIG. 8, before bonding.

In some embodiments, the bonding multilayer 502 is defined to form an annular portion 502A surrounding the area accommodating the thermoelectric elements 237, 249 in the thermoelectric generator structure 500 (see also FIGS. 9A and 9B). The bonding multilayer 502 further forms intermediate finger-like portions 502B that may be arranged in various ways in order to allow a good bonding and to allow connections to extend on surface 500A of thermoelectric generator structure 500 or on the first surface 501A of the third silicon wafer 501.

Figure 10:
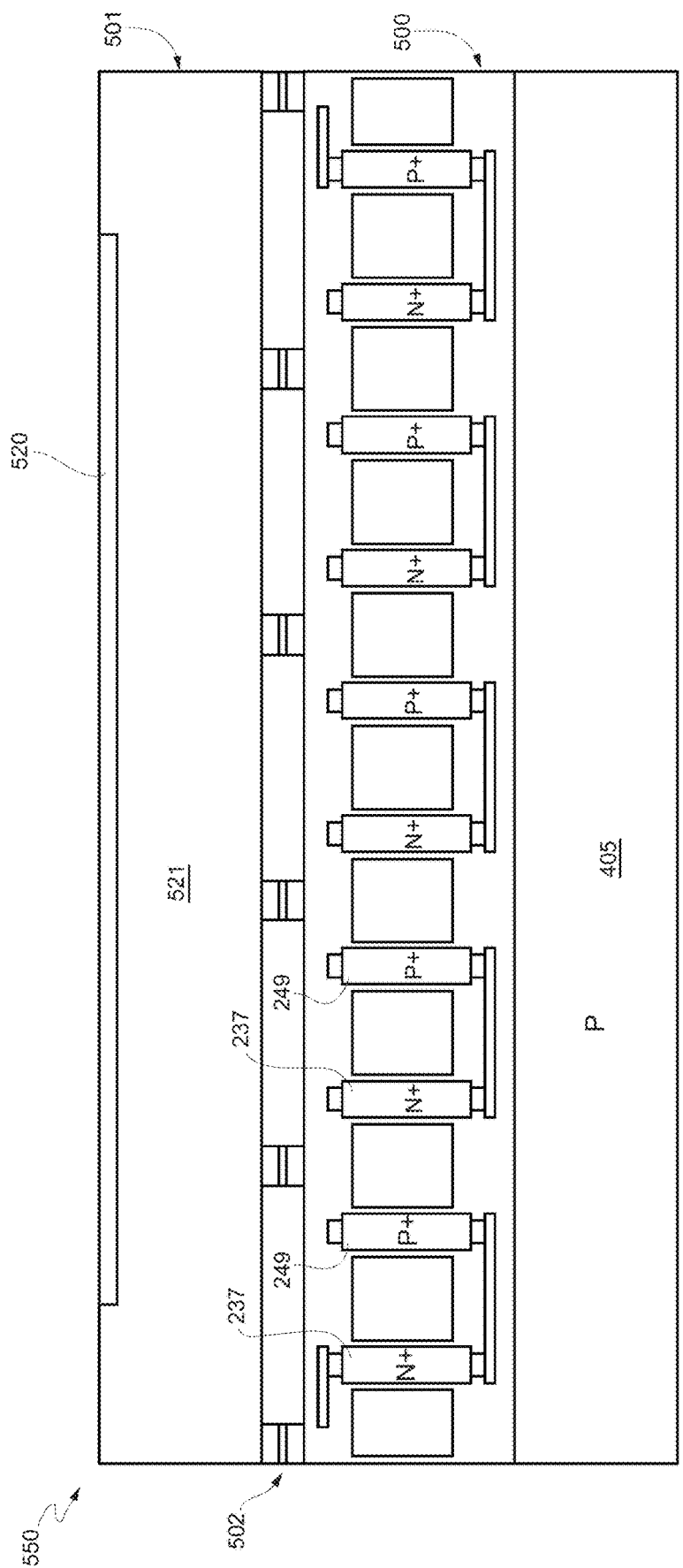
FIG. 10 is a cross-section of the solar energy recovery device of FIG. 8 in a further manufacturing step.
Figure 11:
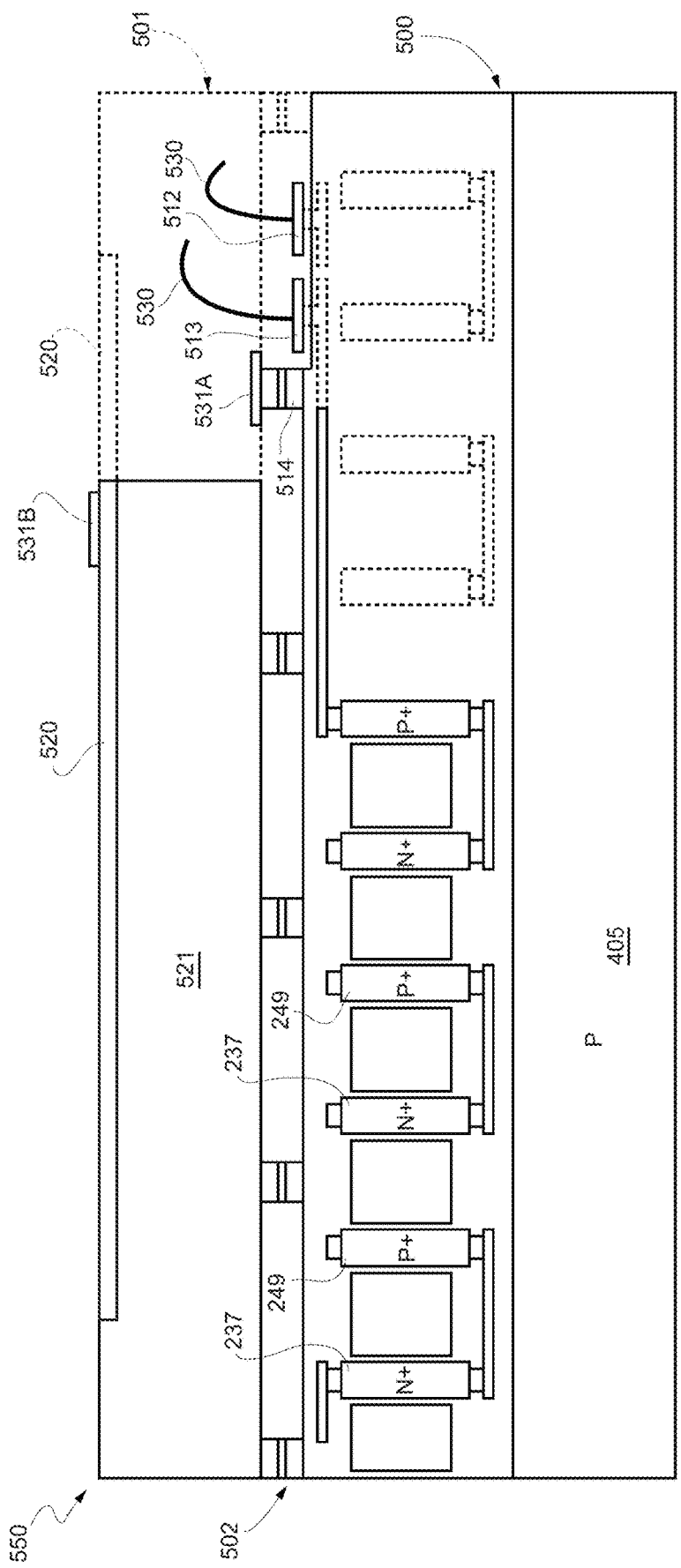
FIG. 11 is a cross-section taken along section line XI-XI of FIGS. 12A and 12B of the solar energy recovery device of FIG. 10 in a further manufacturing step.

For example, the thermoelectric elements 237, 249 of FIG. 8 form a plurality of thermoelectric modules 510 (see FIG. 9A), coupled in parallel to each other. In the embodiment of FIGS. 8, 10 and 11, each thermoelectric module 510 may comprise one row thermoelectric elements 237 and one row of thermoelectric elements 249 (see, e.g., FIG. 6), coupled as also shown in FIG. 6; in the alternative, each thermoelectric module 510 may comprise the entire structure shown in e.g., FIG. 6.

In some embodiments, the thermoelectric modules 510 are coupled by connections 511 that may be formed partly in the oxide layer 270 and partly on the oxide layer 415 (FIG. 8). Connections 511 are coupled to an input pad 512 and to an output pad 513 arranged on the periphery of the thermoelectric generator structure 500 in an interruption of the annular portion 502A of bonding multilayer 502. Input pad 512 and output pad 513 may be coupled to input contact pad 413' and to output contact pad 413" of FIG. 6 by vias, in a per se known manner. In addition, the annular portion 502A forms a anode pad 514, as explained hereinafter.

In FIG. 10, an implant of N$^+$-type doping species is performed in the third wafer 501 through the second surface 501B thereof. For example, suitable N$^+$-type doping species may be phosphorus or arsenic.

Then, the implant is annealed and activated by a powerful laser beam pulse. The pulse length may be in the order of a hundred nanosecond (<200 ns). Thereby, cathode region 520 is formed. The heat generated by the pulse is enough for local annealing, eliminating local implantation damages and activating the dopants. In particular, using a very short pulse, no temperature change is produced in the metal regions; thereby, the bonding multilayer 502, the first and second conductive lines 257, 413 and the connections 511 are not affected.

Cathode region 520 forms, together with the underlying portion of the third wafer 501 (also called hereinafter substrate 521, of P-type), a diode that is able to convert solar energy into a current, in a per se known manner. Thereby, the third wafer 501 forms a solar photovoltaic cell wafer 201.

Figure 12A:
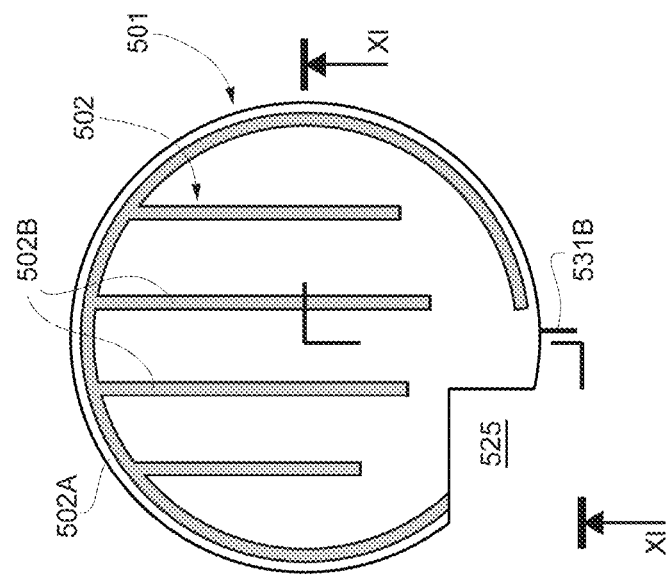
FIG. 12A is a top plan view of the thermoelectric wafer of FIG. 11.
Figure 12B:
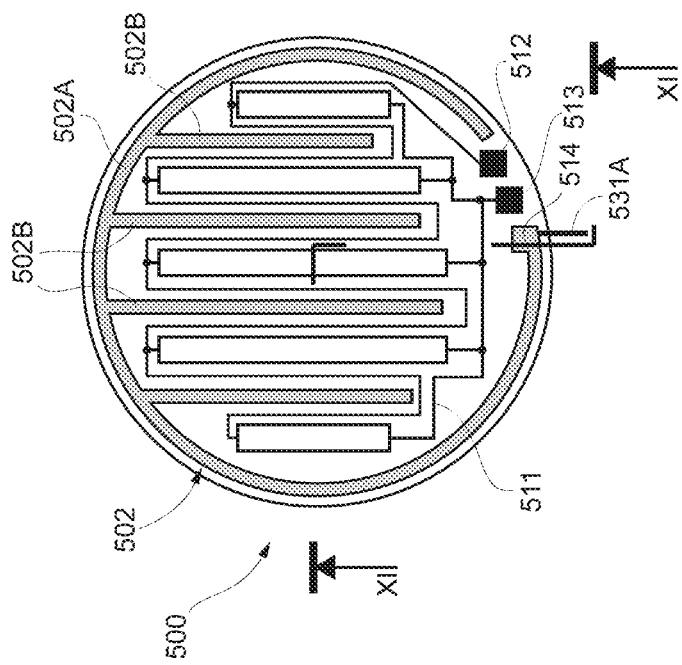
FIG. 12B is a bottom plan view of the solar cell wafer of FIG. 11.

In FIG. 11, the third wafer 501 is etched, to remove a portion thereof overlying pads 512-514 (see also FIGS. 12A, 12B showing the thermoelectric generator structure 500 and the third wafer 501 as if there were not yet bonded). Etching may be performed by laser or blade cutting. Thereby, a recess 525 is formed that exposes pads 512-514.

Wires 530 are bonded to the input and output pads 512, 513 and external connections 531A, 531B are bonded to the anode pad 514 and to the cathode region 520, respectively. The external connections 531A, 531B may be wires or cables.

Thereby, a solar photovoltaic-thermoelectric module 550 is obtained.

Figure 13:
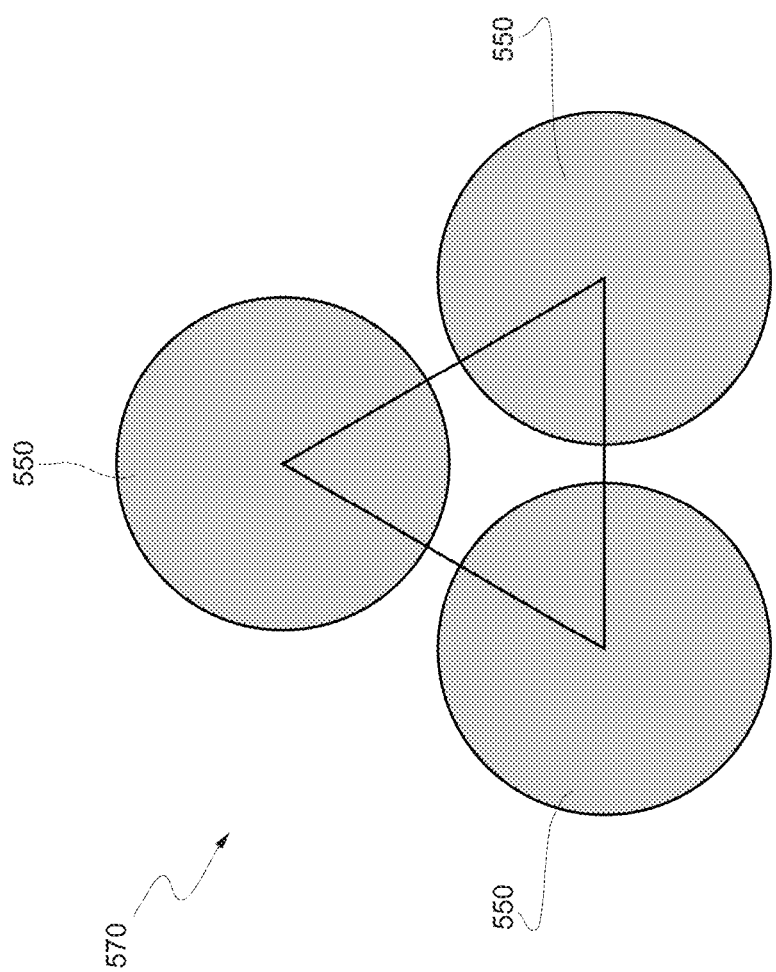
FIG. 13 is a scheme depicting a possible connection of the solar energy recovery device of FIG. 11.

FIG. 13 shows an example connection of three solar photovoltaic-thermoelectric modules 550 to form a hybrid solar energy recovery device 570. In general, a plurality of solar photovoltaic-thermoelectric modules 550 may be coupled to each other in series or in parallel, with the input pads 512 of all solar photovoltaic-thermoelectric modules 550 coupled together and the output pads 513 of all solar photovoltaic-thermoelectric modules 550 coupled together, through respective external connections 531A, 531B.

Hybrid solar photovoltaic-thermoelectric device 570 is able to efficiently recover electric energy.

Conventional solar cells are able to absorb photon energy of the solar radiation only at frequencies that are near the solar cell band-gap and the remaining energy is converted into thermal energy and wasted. In addition, the conversion efficiency drops with temperature.

Vice versa, with the solar photovoltaic-thermoelectric modules of FIGS. 8-12, waste heat produced at the solar photovoltaic cell wafer 501 may be recovered by the thermoelectric generator structure 500 and the total power is the sum of the power supplied by the thermoelectric generator 500 and the power supplied by the solar photovoltaic cell wafer 501, thereby providing a synergetic effect.

Manufacturing may be made using usual techniques in the semiconductor industry. For example, the solar photovoltaic cell wafer 501 is bonded before front end. In this way, possible breakages (for example of metal regions) that may occur during bonding due to the pressure exerted by the piston on the two wafers are avoided.

Figure 14:
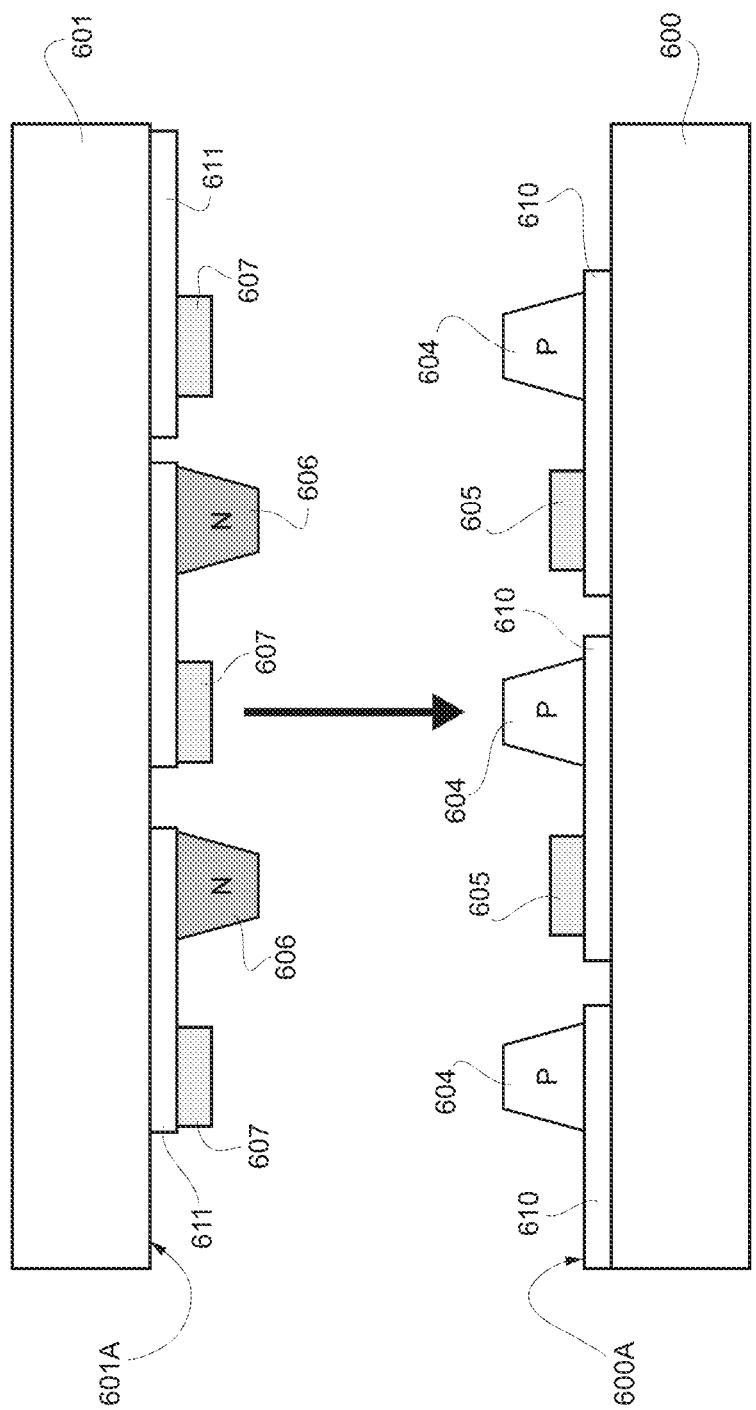
FIGS. 14 and 15 show cross-sections of another solar energy recovery device in different manufacturing steps.
Figure 15:
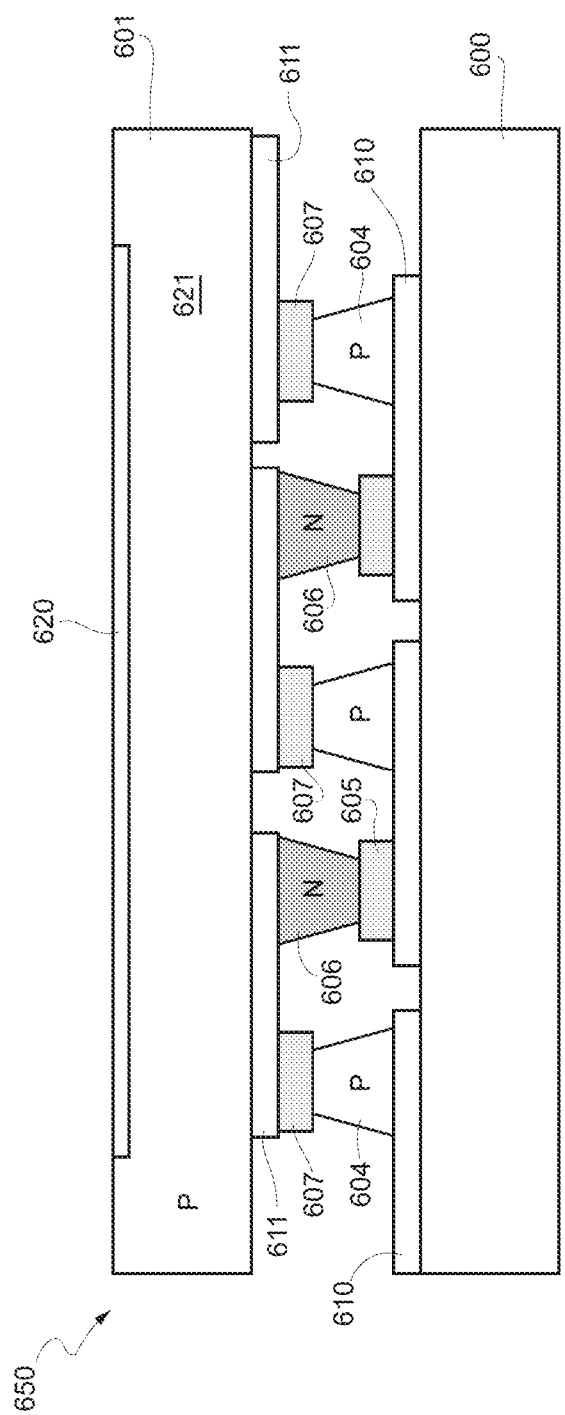

FIGS. 14 and 15 show another embodiment of a thermoelectric generator, obtained by aerosol jet printing of a semiconductor material. In particular, Maskless Mesoscale Material Deposition (M3D) may be used for depositing the semiconductor material. According to one aspect of the present disclosure, bismuth telluride ($Bi_2Te_3$) regions of opposite conductivity type are printed.

For example, FIG. 14 shows a first wafer 600 and a second wafer 601. First and second wafers 600, 601 may be silicon wafers, for example monocrystalline silicon wafers. One of the wafers 600, 601, here second wafer 601, is P-type.

First wafer 600 has a surface 600A on which alternatively P-type bismuth telluride regions 604 and first adhesion regions 605 have been deposited using M3D.

Second wafer 601 has a surface 601A on which alternatively N-type bismuth telluride regions 606 and second adhesion regions 607 have been deposited using M3D.

P-type bismuth telluride regions 604 and first adhesion regions 605 are deposited on first metal regions 610 extending on the surface 600A of the first wafer 600. N-type bismuth telluride regions 606 and second adhesion regions 607 are deposited on second metal regions 611. First and second metal regions 610, 611 may be, for example, of gold (Au).

For example, a bismuth telluride region 604 or 606 and an adhesion region 605 or 607 are formed on each metal region 610 and the distance between a P-type bismuth telluride region 604 and the adjacent first adhesion regions 605 is the same as the distance between an N-type bismuth telluride region 606 and the adjacent second adhesion regions 607.

In addition, although completely visible in FIGS. 14-15, metal regions 610, 611 typically have the pattern shown in FIG. 5 or 6 for the conductive lines 143 or 257 and 413 for connecting the bismuth telluride regions 604, 606 in series. Adhesion regions 605 and 607 may be a tin-silver (Sn—Ag) alloy and have a lower thickness than the bismuth telluride regions 604, 606. Bismuth telluride regions 604, 606 have here the same thickness, for example in the range 20-30 µm; adhesion regions 605, 607 have the same thickness, for example in the range 1-2 µm.

First and second wafers 600, 601 are bonded to each other by turning one wafer (here second wafer 601) upside down and bonding the P-type bismuth telluride regions 604 to the second adhesion regions 607 and the N-type bismuth telluride regions 606 to the first adhesion regions 605, FIG. 15.

Bonding may be done by applying a pressure (e.g. 1-20 MPa) at a low temperature, e.g., about 400° C.

After bonding, bismuth telluride regions 604, 606 form thermoelectric elements.

Then, an implant of N+-type doping species is performed in one of the wafers 600, 601, here second wafer 601, through its exposed surface. For example, phosphorus or arsenic ions are implanted.

Then, the implant is annealed and activated by a powerful laser beam pulse, forming cathode region 620. The rest of the second wafer 601 forms an anode region 621.

The structure of FIG. 15 may be subject to the manufacturing step discussed above with reference to FIGS. 11, 12A and 12B Thereby, a solar photovoltaic-thermoelectric module 650 is obtained.

A plurality of solar photovoltaic-thermoelectric modules 650 may be coupled as shown in FIG. 13, to form a hybrid solar energy recovery device.

Figure 16:
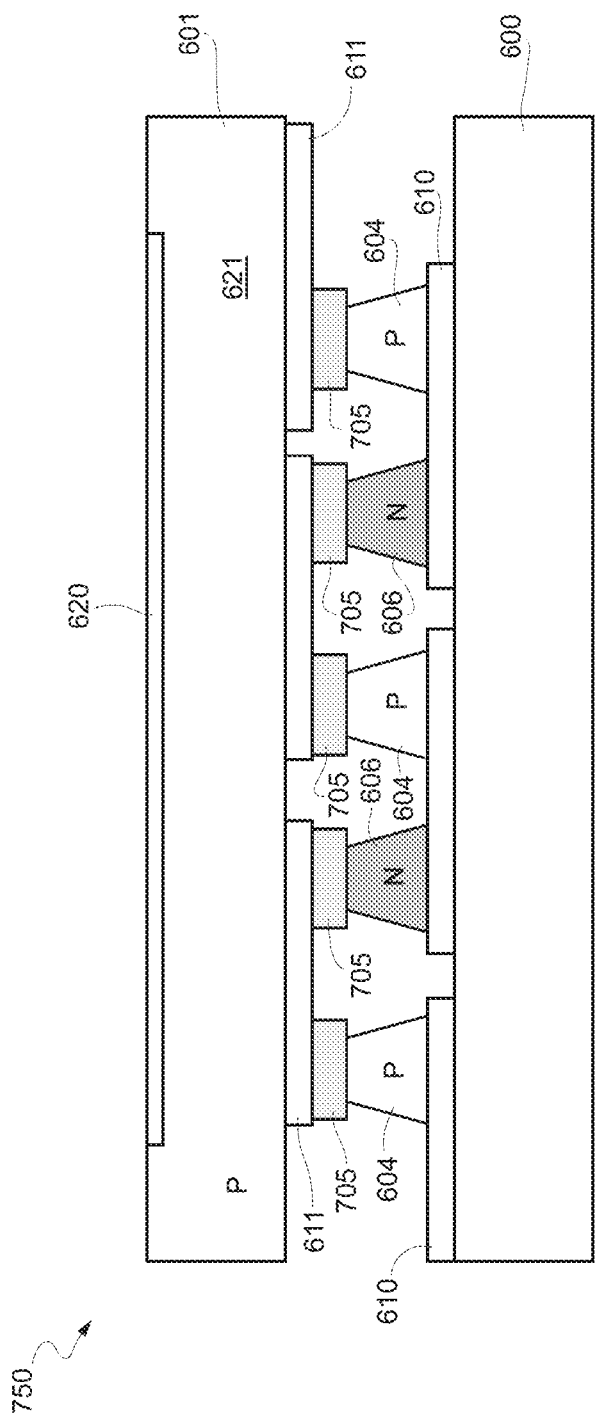
FIG. 16 is a cross-section of a different solar energy recovery device.

FIG. 16 shows a solar photovoltaic-thermoelectric module 750 that is similar to solar photovoltaic-thermoelectric module 650 of FIG. 15 but for the arrangement of the bismuth telluride regions 604, 606 that are here all formed on a same wafer, here the first wafer 600 and the adhesion regions, here denoted by reference number 705, that are all formed on the other wafer, here the second wafer 601. The other elements have been denoted by same reference numbers of FIGS. 14-15.

In some implementations, in the embodiment of FIG. 16, through a M3D printing technique, both P-type and N-type bismuth telluride regions 604, 606 are printed on the first wafer 600 (after forming the first metal regions 610), and the adhesion regions 705 are printed all on the second wafer 601 (after forming the second metal regions 611).

After bonding the first and second wafers 600, 601, the solar photovoltaic-thermoelectric module 750 is obtained.

Figure 17:
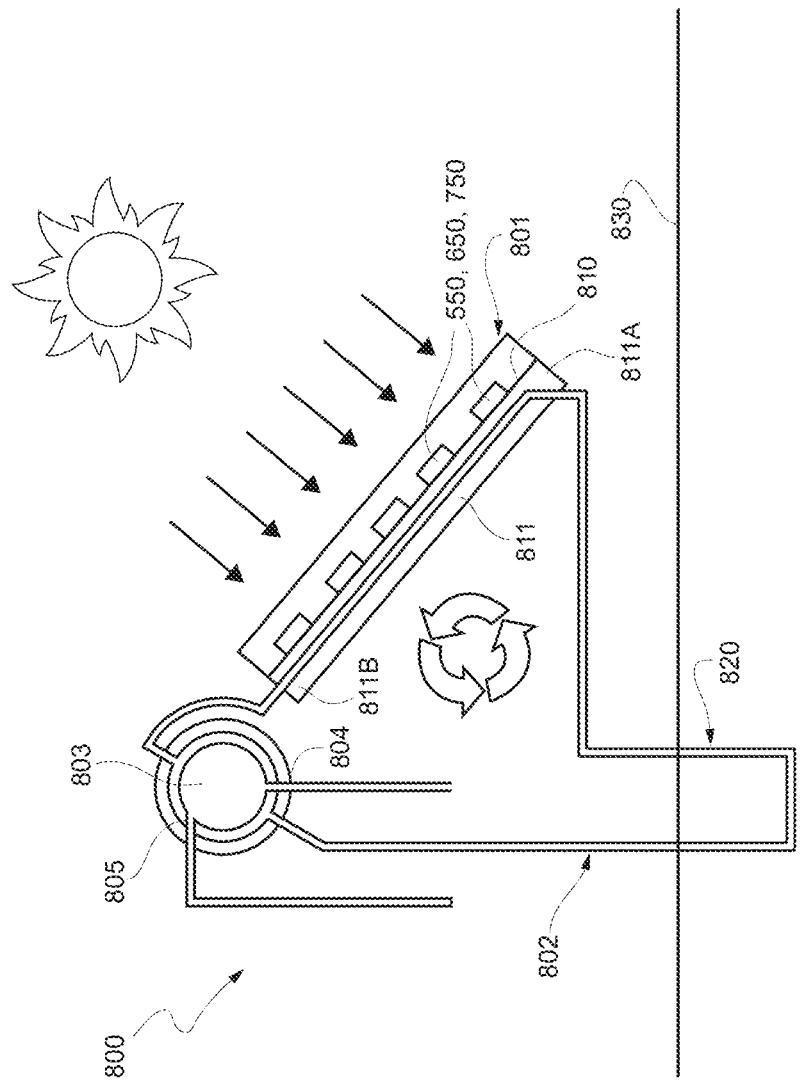
FIG. 17 is a schematic representation of a system disclosed therein.

The energy recovered by solar photovoltaic-thermoelectric module 650 of FIG. 15 or the solar photovoltaic-thermoelectric module 750 of FIG. 16 may be increased by the use of a passive cooling system, as shown in FIG. 17.

FIG. 17 shows a solar energy recovery system 800 comprising a solar collector panel 801 and a loop 802 for recirculating a cooling fluid. In the considered embodiment, the cooling fluid is water and the following description is made considering water; other cooling fluids may however be used.

A tank 803, having a cold water input tap 804 and a warm water output tap 805, is arranged along the water recirculation loop 802.

The solar collector panel 801 accommodates a plurality of solar photovoltaic-thermoelectric modules 550, 650 or 750, coupled together as shown in FIG. 13. The solar photovoltaic-thermoelectric modules 550, 650 or 750 may be attached to a support wall 810 that delimits a water chamber 811 arranged along the loop 802. The water chamber 811 has an input (cold) side 811A and an output (warm) side 811B; the tank 803 is arranged near the output (warm) side 811B of the water chamber 811.

The water in the loop 802 circulate without the need of pumps, due to the temperature gradient between the input (cold) side 811A and the output (warm) side 811B, as well as because of the principle of communication vessels.

For example, in an embodiment, the loop 802 may include an underground section 820 that extends under the ground level (indicated by 830 in FIG. 17). In particular, by arranging underground section 820 at a depth of 8-10 m below the ground level 830, a particularly efficient extraction of heat from the cooling water is obtained, and no refrigeration machine or pump is needed.

The loop 802, by recirculating the cooling water, provides a cooling of the solar collector panel 801 and thus a reduction in the temperature of the solar photovoltaic cell wafers 501, 601 as well as an increase in the photovoltaic effect.

Figure 18:
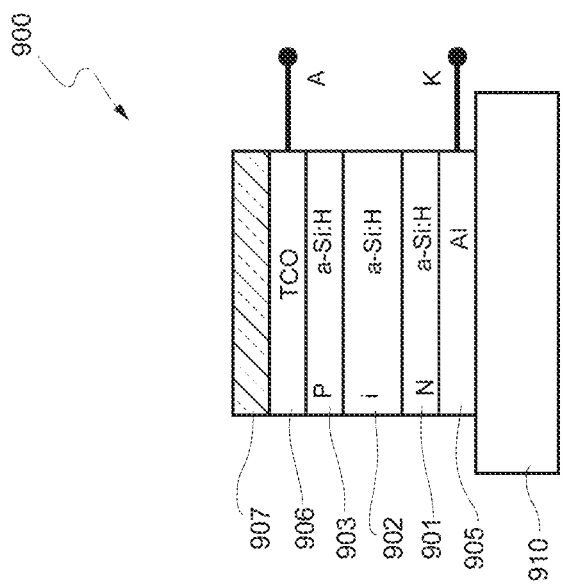
FIG. 18 is a cross-section of an example of a solar cell wafer that may be used in the solar energy recovery device according to this disclosure.

FIG. 18 shows a possible embodiment of a solar photovoltaic cell wafer 900.

Solar photovoltaic cell wafer 900 is based on the use of amorphous silicon, in case passivated by hydrogen (a-Si:H) and comprises a stack formed by a first doped layer 901, having an N-type conductivity; an intermediate, intrinsic layer 902, overlying the first doped layer 901; and a second doped layer 903, having a P-type conductivity, overlying the intermediate, intrinsic layer 902.

For example, the structure of FIG. 18 may be obtained starting from the structure of FIG. 8, by depositing, above the third wafer 501, an aluminum layer 905, the first doped layer 901, the intermediate, intrinsic layer 902, the second doped layer 903, a transparent conductive oxide (TCO) layer 906, and a glass layer 907.

In an embodiment, the first doped layer 901 may have a thickness of about 10 nm; the intermediate, intrinsic layer 902 may have a thickness of about 400 nm; and the second doped layer 901 may have a thickness of about 10 nm.

The TCO layer 906 may be, e.g., of indium-tin oxide.

The intermediate, intrinsic layer 902 provides for an efficient absorption of light radiation, while the first and second doped layers 901, 903 provide an efficient generation of an electronic current, due to the fact that the electron-hole recombination is particularly high in doped silicon. The solar photovoltaic cell wafer 900 is thus very efficient and may advantageously combined with the thermoelectric generator structure described herein, for example with thermoelectric generator structure 500.

A method of fabricating a thermoelectric converter may be summarized as including providing a layer (115; 215) of a Silicon-based material having a first surface and a second surface, opposite to and separated from the first surface by a Silicon-based material layer thickness; forming a plurality of first thermoelectrically active elements (133a; 237; 330a) of a first thermoelectric semiconductor material having a first Seebeck coefficient, and forming a plurality of second thermoelectrically active elements (133b; 249; 330b) of a second thermoelectric semiconductor material having a second Seebeck coefficient, wherein the first and second thermoelectrically active elements are formed to extend through the Silicon-based material layer (115; 215) thickness, from the first surface to the second surface; forming electrically conductive interconnections (143, 413; 257, 413) in correspondence of the first surface and of the second surface of the layer of Silicon-based material (115; 215), for electrically interconnecting the plurality of first thermoelectrically active elements and the plurality of second thermoelectrically active elements, and forming an input electrical terminal (257') and an output electrical terminal (257") electrically connected to the electrically conductive interconnections, wherein the first thermoelectric semiconductor material and the second thermoelectric semiconductor material comprise Silicon-based materials selected among porous Silicon or polysilicon SiGe or polycrystalline Silicon.

Said layer (115; 215) of a Silicon-based material may be a material selected among polySiGe, particularly polySi$_{0.7}$Ge$_{0.3}$, or Epipoly-Si.

Said plurality of first thermoelectrically active elements (133a; 237; 330a) of the first thermoelectric semiconductor material having a first Seebeck coefficient may include doped porous Silicon or polysilicon SiGe or polycrystalline Silicon doped with acceptor dopants or donor dopants, and said plurality of second thermoelectrically active elements (133b; 249; 330b) of said second thermoelectric semiconductor material having a second Seebeck coefficient may include doped porous Silicon or polysilicon SiGe or polycrystalline Silicon doped with donor dopants or acceptor dopants, respectively.

Said providing the layer (115; 215) of a Silicon-based material may include growing epitaxially a layer (115; 215) of polycrystalline Silicon on oxidized surface of a substrate.

Said forming the plurality of first thermoelectrically active elements (237) of the first thermoelectric semiconductor material having a first Seebeck coefficient may include forming first trenches (225, 230) in the layer (215) of a Silicon-based material, filling the first trenches with acceptor or donor dopants doped polycrystalline Silicon or polysilicon SiGe, and wherein said forming the plurality of second thermoelectrically active elements (249) of the second thermoelectric semiconductor material having a second Seebeck coefficient may include forming second trenches (240, 245) in the layer (215) of a Silicon-based material, filling the second trenches with donor or acceptor dopants doped polycrystalline Silicon or polysilicon SiGe.

The method may further include converting the doped polycrystalline Silicon filling the first and second trenches into doped porous Silicon.

Said providing the layer of a Silicon-based material may include iterating at least twice the following steps forming a layer (115) of polysilicon SiGe on an oxidized surface of a substrate (205), wherein said layer (115) of polysilicon SiGe has a fractional thickness compared to said Silicon-based material layer thickness; selectively doping first regions (120a) of the layer of polysilicon SiGe with acceptor or donor dopants, and selectively doping second regions (120b) of the layer of polysilicon SiGe with donor or acceptor dopants, such that after said iterating, a stack of the individual layers (115) of polysilicon SiGe has an overall thickness corresponding to said Silicon-based material layer thickness, forming trenches (130) in the stack of the individual layers of polysilicon SiGe to obtain separated portions (133a, 133b) of doped first regions and doped second regions.

An integrated thermoelectric converter may be summarized as including a layer (115; 215) of a Silicon-based material having a first surface and a second surface, opposite to and separated from the first surface by a Silicon-based material layer thickness; a plurality of first thermoelectrically active elements (133a; 237; 330a) of a first thermoelectric semiconductor material having a first Seebeck coefficient, and a plurality of second thermoelectrically active elements (133b; 249; 330b) of a second thermoelectric semiconductor material having a second Seebeck coefficient, wherein the first and second thermoelectrically active elements extend through the Silicon-based material layer thickness, from the first surface to the second surface; electrically conductive interconnections (143, 413; 257, 413) in correspondence of the first surface and of the second surface of the layer of Silicon-based material, for electrically interconnecting the plurality of first thermoelectrically active elements and the plurality of second thermoelectrically active elements; and an input electrical terminal (257') and an output electrical terminal (257") electrically connected to the electrically conductive interconnections, wherein the first thermoelectric semiconductor material and the second thermoelectric semiconductor material comprise Silicon-based materials selected among porous Silicon or polycrystalline Silicon or polysilicon SiGe.

Said layer of a Silicon-based material may be a material selected among polySiGe, particularly polySi$_{0.7}$Ge$_{0.3}$ or Epipoly-Si.

Said first thermoelectric semiconductor material having a first Seebeck coefficient may be porous Silicon or polycrystalline Silicon or polysilicon SiGe doped with acceptor dopants or donor dopants, and said second thermoelectric semiconductor material having a second Seebeck coefficient may be porous Silicon or polycrystalline Silicon or polysilicon SiGe doped with donor dopants or acceptor dopants, respectively.

Each of the plurality of first and second thermoelectrically active elements and each of the second thermoelectrically active elements may have a first end at the first surface and a second end at the second surface of the layer of Silicon-based material, and the electrically conductive interconnections may electrically connect the first end of a generic first thermoelectrically active element to the first end of a second thermoelectrically active element, and the second end of the generic first thermoelectrically active element to the second end of another second thermoelectrically active element, so that the plurality of first thermoelectrically active elements and the plurality of second thermoelectrically active elements are connected in series and alternated to one another.

An electronic system (600) may be summarized as including a thermoelectric converter.

The disclosure may be further understood based on the following example implementations.

Example implementation 1: a method of fabricating a thermoelectric converter, comprising: forming a plurality of first thermoelectrically active elements of a first thermoelectric semiconductor material having a first Seebeck coefficient and a plurality of second thermoelectrically active elements of a second thermoelectric semiconductor material having a second Seebeck coefficient in a layer of silicon-based material, the layer of the silicon-based material having a first surface, a second surface opposite to the first surface, and a first thickness between the first surface and the second surface, the first and second thermoelectrically active elements each being formed to extend through the first thickness, from the first surface to the second surface; and forming electrically conductive interconnections over at least one of the first surface or the second surface of the layer of the silicon-based material, the electrically conductive interconnections each electrically interconnecting a first thermoelectrically active element of the plurality of first thermoelectrically active elements and a corresponding one of the plurality of second thermoelectrically active elements; and forming an input electrical terminal and an output electrical terminal electrically coupled to the electrically conductive interconnections, wherein the first thermoelectric semiconductor material and the second thermoelectric semiconductor material each includes a silicon-based material selected from a group consisting of porous silicon, polycrystalline silicon germanium (SiGe), and polycrystalline silicon.

Example implementation 2: the method of example implementation 1, wherein the layer of the silicon-based material is a material selected among polycrystalline SiGe having a material composition of $Si_{0.7}Ge_{0.3}$, or epitaxy polycrystalline silicon.

Example implementation 3: the method of example implementation 1, wherein the plurality of first thermoelectrically active elements of the first thermoelectric semiconductor material having a first Seebeck coefficient are doped with acceptor dopants, and the plurality of second thermoelectrically active elements of the second thermoelectric semiconductor material having a second Seebeck coefficient are doped with donor dopants.

Example implementation 4: the method of example implementation 1, wherein the layer of the silicon-based material is polycrystalline silicon, and the method comprises growing epitaxially the layer of polycrystalline silicon on an oxidized surface of a substrate.

Example implementation 5: the method of example implementation 4, wherein the forming the plurality of first thermoelectrically active elements of the first thermoelectric semiconductor material having the first Seebeck coefficient comprises: forming first trenches in the layer of the silicon-based material, and filling the first trenches with polycrystalline silicon or polycrystalline SiGe doped with acceptor dopants; and wherein the forming the plurality of second thermoelectrically active elements of the second thermoelectric semiconductor material having the second Seebeck coefficient comprises: forming second trenches in the layer of the silicon-based material, and filling the second trenches with polycrystalline silicon or polycrystalline SiGe doped with donor dopants.

Example implementation 6: the method of example implementation 5, wherein each of the first trenches and the second trenches are filled with polycrystalline silicon, and the method further comprises: converting the doped polycrystalline silicon filling the first and second trenches into doped porous silicon.

Example implementation 7: the method of example implementation 1, comprising: forming the layer of the silicon-based material including: iterating at least twice following steps: forming a layer of polycrystalline SiGe on an oxidized surface of a substrate, wherein the layer of polycrystalline SiGe has a fractional thickness compared to the first thickness of the layer of the silicon-based material; selectively doping first regions of the layer of polycrystalline SiGe with acceptor dopants; and selectively doping second regions of the layer of polycrystalline SiGe with donor dopants, wherein after the iterating, a stack of the individual layers of polycrystalline SiGe has an overall thickness corresponding to the first thickness of the layer of the silicon-based material; and forming trenches in the stack of the individual layers of polycrystalline SiGe, thereby obtaining separated portions of doped first regions and doped second regions.

Example implementation 8: the method of example implementation 1, further comprising: bonding the layer of silicon-based material to a solar photovoltaic cell wafer of amorphous silicon.

Example implementation 9: the method of example implementation 8, wherein bonding the layer of silicon-based material comprises forming a conductive bonding layer in electrical contact with the solar photovoltaic cell wafer and forming a first electrical contact for the solar photovoltaic cell wafer.

Example implementation 10: the method of example implementation 9, wherein the solar photovoltaic cell wafer comprises a first region of a first conductivity type, the method including implanting doping species to form a second region of a second conductivity type, opposite to the first conductivity type, and forming a second electrical contact electrically coupled to the second region.

Example implementation 11: a method of fabricating a thermoelectric converter, comprising: forming electrically conductive interconnections on a first wafer and on a second wafer; printing semiconductor regions of a first and a second conductivity type on the electrically conductive interconnections of at least one of the first or the second silicon wafer by maskless mesoscale material deposition according to a pattern; forming bonding regions of conductive material on another one of the at least one of the first or the second silicon wafer, the bonding regions being arranged corresponding to the pattern; and bringing the semiconductor regions in contact with the bonding regions; and bonding the semiconductor regions to the bonding regions by applying a pressure to the first and the second silicon wafers.

Example implementation 12: the method of example implementation 11, wherein the semiconductor regions are bismuth telluride.

Example implementation 13: the method of example implementation 11 wherein the boding regions are formed using maskless mesoscale material deposition.

Example implementation 14: the method of example implementation 11, comprising forming an anode region on a surface of the first silicon wafer that is distal to the second silicon wafer.

Example implementation 15: the method of example implementation 14, comprising forming a cathode region in the first silicon wafer.

Example implementation 16: an integrated thermoelectric converter, comprising: a first column structure, the first column structure including one of porous silicon, polycrystalline silicon germanium, or polycrystalline silicon and doped with a first conductivity type; a second column structure, the second column structure including one of porous silicon, polycrystalline silicon germanium, or polycrystalline silicon and doped with a second conductivity type; and a first electrically conductive interconnection structure in electrical contact with a first end of the first column structure and a first end of the second column structure.

Example implementation 17: the integrated thermoelectric converter of example implementation 16, comprising a first insulation structure surrounding the first column structure and a second insulation structure surrounding the second column structure.

Example implementation 18: the integrated thermoelectric converter of example implementation 16, wherein the first column structure includes polycrystalline silicon germanium, and the first column structure includes a plurality of layers of polycrystalline silicon germanium stacked over one another.

Example implementation 19: the integrated thermoelectric converter of example implementation 16, comprising a substrate, wherein the first column structure includes a first portion of porous silicon and a second portion of polycrystalline silicon, the second portion between the first portion and the substrate.

Example implementation 20: the integrated thermoelectric converter of example implementation 19, wherein the second portion of the first column structure is in contact with the substrate.

Example implementation 21: the integrated thermoelectric converter of example implementation 16, wherein each of the plurality of first thermoelectrically active elements and the plurality of second thermoelectrically active elements is cylindrical.

Example implementation 22: the integrated thermoelectric converter of example implementation 16, comprising: a third column structure, the third column structure including one of porous silicon, polycrystalline silicon germanium, or polycrystalline silicon and doped with the second conductivity type; and a second electrically conductive interconnection structure in electrical contact with a second end of the first column structure and a second end of the third column structure.

Example implementation 23: the integrated thermoelectric converter of example implementation 16, comprising: a fourth column structure, the fourth column structure including one of porous silicon, polycrystalline silicon germanium, or polycrystalline silicon and doped with the first conductivity type; and a third electrically conductive interconnection structure in electrical contact with a second end of the second column structure and a second end of the fourth column structure.

Example implementation 24: the integrated thermoelectric converter of example implementation 16, comprising: an insulation layer covering the first electrically conductive interconnection structure; and a silicon wafer on the insulation layer.

Example implementation 25: an integrated solar photovoltaic-thermoelectric module, comprising: a substrate wafer; first electrically conductive interconnections on the substrate wafer; a thermoelectric converter structure on the substrate layer, the thermoelectric converter structure including a plurality of first thermoelectrically active elements of a first thermoelectric semiconductor material having a first Seebeck coefficient, and a plurality of second thermoelectrically active elements of a second thermoelectric semiconductor material having a second Seebeck coefficient, the first and second thermoelectrically active elements being pillar-shaped and having each a first and a second end, the first end of each first thermoelectrically active element being electrically coupled to the first end of a second thermoelectrically active element by a respective first electrically conductive interconnection; second electrically conductive interconnections coupled to the second ends of the first and second thermoelectrically active elements; a solar cell wafer of amorphous silicon, bonded to the thermoelectric converter structure, the solar cell wafer including an anode region and a cathode region; a first input electrical terminal and a first output electrical terminal electrically coupled to the electrically conductive interconnections; and a second input electrical terminal and a second output electrical terminal electrically coupled to, respectively, the anode region and cathode region.

Example implementation 26: an integrated thermoelectric converter, comprising: a layer of a silicon-based material having a first surface and a second surface opposite to and separated from the first surface by a first thickness of the silicon-based material; a plurality of first thermoelectrically active elements of a first thermoelectric semiconductor material having a first Seebeck coefficient, and a plurality of second thermoelectrically active elements of a second thermoelectric semiconductor material having a second Seebeck coefficient, the first and second thermoelectrically active elements each extending through the first thickness of the layer of the silicon-based material, from the first surface to the second surface; electrically conductive interconnections on at least one of the first surface or the second surface of the layer of the silicon-based material, and each in electrical contact with a first thermoelectrically active element of the plurality of first thermoelectrically active elements and a corresponding one of the plurality of second thermoelectrically active elements; and an input electrical terminal and an output electrical terminal electrically coupled to the electrically conductive interconnections, wherein the first thermoelectric semiconductor material and the second thermoelectric semiconductor material are a silicon-based material selected from a group consisting of porous silicon, polycrystalline silicon, and polycrystalline silicon germanium (SiGe).

Example implementation 27: the thermoelectric converter of example implementation 26, wherein the layer of the silicon-based material is a material selected among polycrystalline SiGe having a material composition of $Si_{0.7}Ge_{0.3}$ or epitaxy polycrystalline silicon.

Example implementation 28: the thermoelectric converter of example implementation 26, wherein the first thermoelectric semiconductor material having the first Seebeck coefficient is doped with acceptor dopants and the second thermoelectric semiconductor material having the second Seebeck coefficient is doped with donor dopants, respectively.

Example implementation 29: the thermoelectric converter of example implementation 26, wherein: each of the plurality of first thermoelectrically active elements and the plurality of second thermoelectrically active elements has a first end at the first surface and a second end at the second surface of the layer of the silicon-based material; and the electrically conductive interconnections electrically connect: a first end of a first thermoelectrically active element to a first end of a second thermoelectrically active element; and a second end of the first thermoelectrically active element to a second end of another second thermoelectrically active element, so that the plurality of first thermoelectrically active elements and the plurality of second thermoelectrically active elements are coupled in series and alternated to one another.

The various embodiments described above can be combined to provide further embodiments. Aspects of the embodiments can be modified to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of fabricating a thermoelectric converter, comprising:
forming a plurality of first thermoelectrically active elements of a first thermoelectric semiconductor material having a first Seebeck coefficient and a plurality of second thermoelectrically active elements of a second thermoelectric semiconductor material having a second Seebeck coefficient in a layer of silicon-based material, the layer of the silicon-based material having a first surface, a second surface opposite to the first surface, and a first thickness between the first surface and the second surface, the first and second thermoelectrically active elements each being formed to extend through the first thickness, from the first surface to the second surface; and forming electrically conductive interconnections over at least one of the first surface or the second surface of the layer of the silicon-based material, the electrically conductive interconnections each electrically interconnecting a first thermoelectrically active element of the plurality of first thermoelectrically active elements and a corresponding one of the plurality of second thermoelectrically active elements; and forming an input electrical terminal and an output electrical terminal electrically coupled to the electrically conductive interconnections, wherein the first thermoelectric semiconductor material and the second thermoelectric semiconductor material each includes a silicon-based material selected from a group consisting of porous silicon, polycrystalline silicon germanium (SiGe), and polycrystalline silicon, and wherein the forming the plurality of first thermoelectrically active elements and the plurality of second thermoelectrically active elements includes forming ring-shaped trenches around each of the plurality of first thermoelectrically active elements and the plurality of second thermoelectrically active elements, respectively.

2. The method of claim 1, wherein the layer of the silicon-based material is a material selected among polycrystalline SiGe having a material composition of $Si_{0.7}Ge_{0.3}$, or epitaxy polycrystalline silicon.

3. The method of claim 1, wherein the plurality of first thermoelectrically active elements of the first thermoelectric semiconductor material having a first Seebeck coefficient are doped with acceptor dopants, and the plurality of second thermoelectrically active elements of the second thermoelectric semiconductor material having a second Seebeck coefficient are doped with donor dopants.

4. The method of claim 1, wherein the layer of the silicon-based material is polycrystalline silicon, and the method comprises growing epitaxially the layer of polycrystalline silicon on an oxidized surface of a substrate.

5. The method of claim 1, comprising:
forming the layer of the silicon-based material including:
iterating at least twice following steps:
forming a layer of polycrystalline SiGe on an oxidized surface of a substrate, wherein the layer of polycrystalline SiGe has a fractional thickness compared to the first thickness of the layer of the silicon-based material;

selectively doping first regions of the layer of polycrystalline SiGe with acceptor dopants; and
selectively doping second regions of the layer of polycrystalline SiGe with donor dopants,
wherein after the iterating, a stack of the individual layers of polycrystalline SiGe has an overall thickness corresponding to the first thickness of the layer of the silicon-based material; and
wherein the forming the ring-shaped trenches includes forming in the stack of the individual layers of polycrystalline SiGe, thereby obtaining separated portions of doped first regions and doped second regions.

6. The method of claim 1, further comprising:
bonding the layer of silicon-based material to a solar photovoltaic cell wafer of amorphous silicon.

7. The method of claim 6, wherein bonding the layer of silicon-based material comprises forming a conductive bonding layer in electrical contact with the solar photovoltaic cell wafer and forming a first electrical contact for the solar photovoltaic cell wafer.

8. The method of claim 7, wherein the solar photovoltaic cell wafer comprises a first region of a first conductivity type, the method including implanting doping species to form a second region of a second conductivity type, opposite to the first conductivity type, and forming a second electrical contact electrically coupled to the second region.

9. A method, comprising:
forming a first column structure, the first column structure including one of porous silicon, polycrystalline silicon germanium, or polycrystalline silicon;
doping the first column structure with a first conductivity type;
forming a second column structure, the second column structure including one of porous silicon, polycrystalline silicon germanium, or polycrystalline silicon;
doping the second column structure with a second conductivity type; and
forming a first electrically conductive interconnection structure in electrical contact with a first end of the first column structure and a first end of the second column structure,
wherein the forming the first column structure and forming the second column structure each includes forming ring-shaped trenches around each of the first column structure and the second column structure, respectively.

10. The method of claim 9, comprising:
forming a first insulation structure surrounding the first column structure; and
forming a second insulation structure surrounding the second column structure.

11. The method of claim 9, wherein the forming the first column structure includes forming a plurality of layers of polycrystalline silicon germanium stacked over one another.

* * * * *